(12) United States Patent
Berman et al.

(10) Patent No.: US 11,634,259 B2
(45) Date of Patent: Apr. 25, 2023

(54) REUSABLE SHIPPING PLATFORM FOR TRANSPORTING MULTIPLE ELECTRICAL CIRCUIT BREAKERS

(71) Applicant: Logistics Advanced Research Center LLC, Nashville, TN (US)

(72) Inventors: Samuel Jacob Berman, Nashville, TN (US); John Christopher Taylor, Nashville, TN (US); Jeremy Merrill, Fort Atkinson, IA (US)

(73) Assignee: LOGISTICS ADVANCED RESEARCH CENTER LLC, Nashville, TN (US)

( * ) Notice: Subject to any disclaimer, the term of this patent is extended or adjusted under 35 U.S.C. 154(b) by 61 days.

(21) Appl. No.: 17/304,009

(22) Filed: Jun. 11, 2021

(65) Prior Publication Data
US 2021/0300652 A1  Sep. 30, 2021

Related U.S. Application Data

(63) Continuation-in-part of application No. 17/001,603, filed on Aug. 24, 2020, now Pat. No. 11,312,534.
(Continued)

(51) Int. Cl.
*B65D 71/00* (2006.01)
*H05K 1/02* (2006.01)

(52) U.S. Cl.
CPC ....... *B65D 71/0088* (2013.01); *H05K 1/0295* (2013.01); *H05K 2201/10053* (2013.01)

(58) Field of Classification Search
CPC .... B65D 71/0088; B65D 19/44; B65D 19/00; B65D 19/02; B65D 19/06; B65D 19/12;
(Continued)

(56) References Cited

U.S. PATENT DOCUMENTS

| 3,133,511 A | 5/1964 | Phillips |
| 4,015,710 A * | 4/1977 | Biggs .................... B65D 19/44 |
| | | 248/346.02 |

(Continued)

FOREIGN PATENT DOCUMENTS

| DE | 102019116227 | 9/2020 |
| FR | 2654703 | 5/1991 |

(Continued)

*Primary Examiner* — Jose V Chen
(74) *Attorney, Agent, or Firm* — Andre J. Bahou; Christopher T. McNeill; Holland & Knight LLP

(57) ABSTRACT

An apparatus may include a breadboard. The breadboard may include a substantially flat board, which may include a top surface and a bottom surface. The top surface may be disposed opposite the bottom surface. The board may include one or more openings disposed in the board. The apparatus may include a pallet. The pallet may include a top surface and a bottom portion disposed opposite the top surface. The pallet may include a plurality of risers, which may be disposed on the bottom portion and extend in a direction opposite the top surface. The bottom surface of the breadboard may be mountable to the top surface of the pallet. One or more circuit breakers may be disposable on the top surface of the board of the breadboard. The breadboard and pallet may be reusable in transporting circuit breakers.

20 Claims, 23 Drawing Sheets

Related U.S. Application Data

(60) Provisional application No. 63/037,981, filed on Jun. 11, 2020, provisional application No. 62/891,340, filed on Aug. 24, 2019.

(58) Field of Classification Search
CPC .......... B65D 19/18; B65D 2519/00965; B65D 2519/0096
USPC ..... 108/55.1, 53.1, 55.5, 55.3; 206/600, 386
See application file for complete search history.

(56) References Cited

U.S. PATENT DOCUMENTS

| | | | |
|---|---|---|---|
| 4,673,087 A | 6/1987 | Webb | |
| 4,896,612 A * | 1/1990 | Salloum | B65D 19/44 |
| | | | 108/55.3 |
| 4,944,404 A | 7/1990 | Mead | |
| 5,109,985 A | 5/1992 | Rose | |
| 5,133,460 A | 7/1992 | Shuert | |
| 5,154,286 A * | 10/1992 | Gits | B65D 19/44 |
| | | | 206/319 |
| 5,180,134 A * | 1/1993 | Mallak | B65G 7/02 |
| | | | 248/346.03 |
| 5,253,763 A | 10/1993 | Kirkley | |
| 5,829,595 A | 11/1998 | Brown | |
| 5,842,424 A * | 12/1998 | Prevot | B65D 19/44 |
| | | | 108/55.3 |
| 5,865,315 A * | 2/1999 | Uitz | B65D 71/0088 |
| | | | 206/499 |
| 5,970,885 A * | 10/1999 | Polando | B65D 19/44 |
| | | | 108/55.3 |
| 5,970,886 A * | 10/1999 | Knio | B65D 19/38 |
| | | | 108/57.12 |
| 6,032,815 A | 3/2000 | Elstone | |
| 6,035,790 A * | 3/2000 | Polando | B65D 19/44 |
| | | | 108/55.1 |
| 6,050,410 A | 4/2000 | Quirion | |
| 6,105,511 A | 8/2000 | Bridges | |
| 6,170,689 B1 | 1/2001 | Flesher | |
| 6,182,849 B1 | 2/2001 | Elstone | |
| 6,299,011 B1 | 10/2001 | Rosenfeldt | |
| 6,820,761 B1 | 11/2004 | Mouri | |
| 7,219,609 B1 * | 5/2007 | Utz | B65D 19/44 |
| | | | 108/55.3 |
| 7,290,663 B2 | 11/2007 | Deng | |
| 7,555,879 B1 * | 7/2009 | Utz | B65D 19/44 |
| | | | 53/410 |
| 8,413,831 B2 | 4/2013 | Nolan | |
| 8,608,003 B2 | 12/2013 | Uno | |
| 8,640,912 B2 | 2/2014 | Orfeldinger | |
| 11,312,534 B2 * | 4/2022 | Berman | B65D 19/06 |
| 2005/0150892 A1 | 7/2005 | Miller | |
| 2009/0134057 A1 | 5/2009 | Vargas | |
| 2011/0017106 A1 | 1/2011 | Muirhead | |
| 2013/0048522 A1 | 2/2013 | Lorenz | |
| 2014/0090581 A1 * | 4/2014 | Schultz | B65D 19/0095 |
| | | | 248/634 |
| 2014/0197168 A1 | 7/2014 | Miller | |
| 2015/0108037 A1 | 4/2015 | Evans | |
| 2015/0175304 A1 | 6/2015 | Ficker | |
| 2015/0217902 A1 | 8/2015 | Dubois | |
| 2016/0001922 A1 | 1/2016 | Sadykov | |
| 2017/0190467 A1 * | 7/2017 | Clark | B65D 19/04 |
| 2019/0034863 A1 | 1/2019 | Winkle | |
| 2019/0135488 A1 | 5/2019 | Douralis | |
| 2020/0062482 A1 * | 2/2020 | Alfoqaha | B65D 19/44 |
| 2020/0109004 A1 * | 4/2020 | Martin, Jr. | B65D 88/12 |
| 2020/0122885 A1 | 4/2020 | Dent | |
| 2021/0180745 A1 * | 6/2021 | Aliwi | B65D 85/68 |
| 2021/0380311 A1 * | 12/2021 | Schwarz | B65D 19/44 |

FOREIGN PATENT DOCUMENTS

| | | |
|---|---|---|
| GB | 2347668 | 9/2000 |
| WO | 2009121092 | 10/2009 |

* cited by examiner

REUSABLE SHIPPING PLATFORM FOR TRANSPORTING MULTIPLE ELECTRICAL CIRCUIT BREAKERS

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application is a continuation-in-part of U.S. patent application Ser. No. 17/001,603, filed Aug. 24, 2020, entitled "MODULAR REUSABLE SHIPPING CRATE;" which claims priority to U.S. Provisional Patent Application Ser. No. 63/037,981, filed Jun. 11, 2020, entitled "REUSABLE SHIPPING PLATFORM FOR TRANSPORTING MULTIPLE ELECTRICAL CIRCUIT BREAKERS;" and claims priority to U.S. Provisional Patent Application No. 62/891,340, filed Aug. 24, 2019, entitled "MODULAR REUSABLE SHIPPING CRATE." The entirety of these applications are hereby incorporated by reference.

TECHNICAL FIELD

The present disclosure generally relates to shipping cargo, and more particularly, to the methods, systems, and devices for transport, storage, and logistics management of a variety of cargo.

BACKGROUND

The power distribution industry transports thousands of circuit breakers (sometimes simply referred to as "breakers") with weights ranging from a few pounds to several hundred pounds. Wood pallets with a cardboard overlay or plastic shrink wrap are the standard solution for conveyance. Most often, one pallet is used to transport one breaker with an attached breaker flange being fixed to the pallet by bolts on the top and nuts underneath. While wood pallets are individually inexpensive, they are economically inefficient, resource and energy intensive, and environmentally destructive over the life cycle. Despite their drawbacks, wood pallets remain the primary conveyance used for shipping many products today. The vast majority of these wood pallets are used only one time before being disposed of. What is needed, therefore, is an efficient shipping device that is reusable, environmentally friendly, and efficient for labor, resources, and energy to ship circuit breakers.

BRIEF SUMMARY

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One aspect of the present disclosure may include an apparatus. The apparatus may include a breadboard. The breadboard may include a substantially flat board, which may include a top surface and a bottom surface. The top surface may be disposed opposite the bottom surface. The board may include one or more openings disposed in the board. The apparatus may include a pallet. The pallet may include a top surface and a bottom portion disposed opposite the top surface. The pallet may include a plurality of risers, which may be disposed on the bottom portion and extend in a direction opposite the top surface. The bottom surface of the breadboard may be mountable to the top surface of the pallet. One or more circuit breakers may be disposable on the top surface of the board of the breadboard. The breadboard and pallet may be reusable in transporting circuit breakers.

Another aspect of the disclosure may include a system. The system may include a breadboard. The breadboard may include a substantially flat board, which may include a top surface and a bottom surface. The top surface may be disposed opposite the bottom surface. The board may include one or more openings disposed in the board. The system may include a pallet. The pallet may include a top surface and a bottom portion disposed opposite the top surface. The pallet may include a plurality of risers, which may be disposed on the bottom portion and extend in a direction opposite the top surface. The bottom surface of the breadboard may be mountable to the top surface of the pallet. The system may include a circuit breaker. The circuit breaker may be disposed on the top surface of the board of the breadboard.

Another aspect of the present disclosure may include a method. The method may include a method of transporting and reusing a transport system for a circuit breaker. The method may include, at a first location, mounting a breadboard to a pallet. The breadboard may include a substantially flat board and a plurality of openings. The method may include mounting a first circuit breaker to a top surface of the board of the breadboard. The method may include transporting the breadboard and the pallet to a second location. The method may include, at the second location, dismounting the first circuit breaker from the breadboard. The method may include mounting a second circuit breaker to the top surface of the board of the breadboard.

Numerous other objects, advantages and features of the present disclosure will be readily apparent to those of skill in the art upon a review of the following drawings and description of various embodiments.

Figure 1:
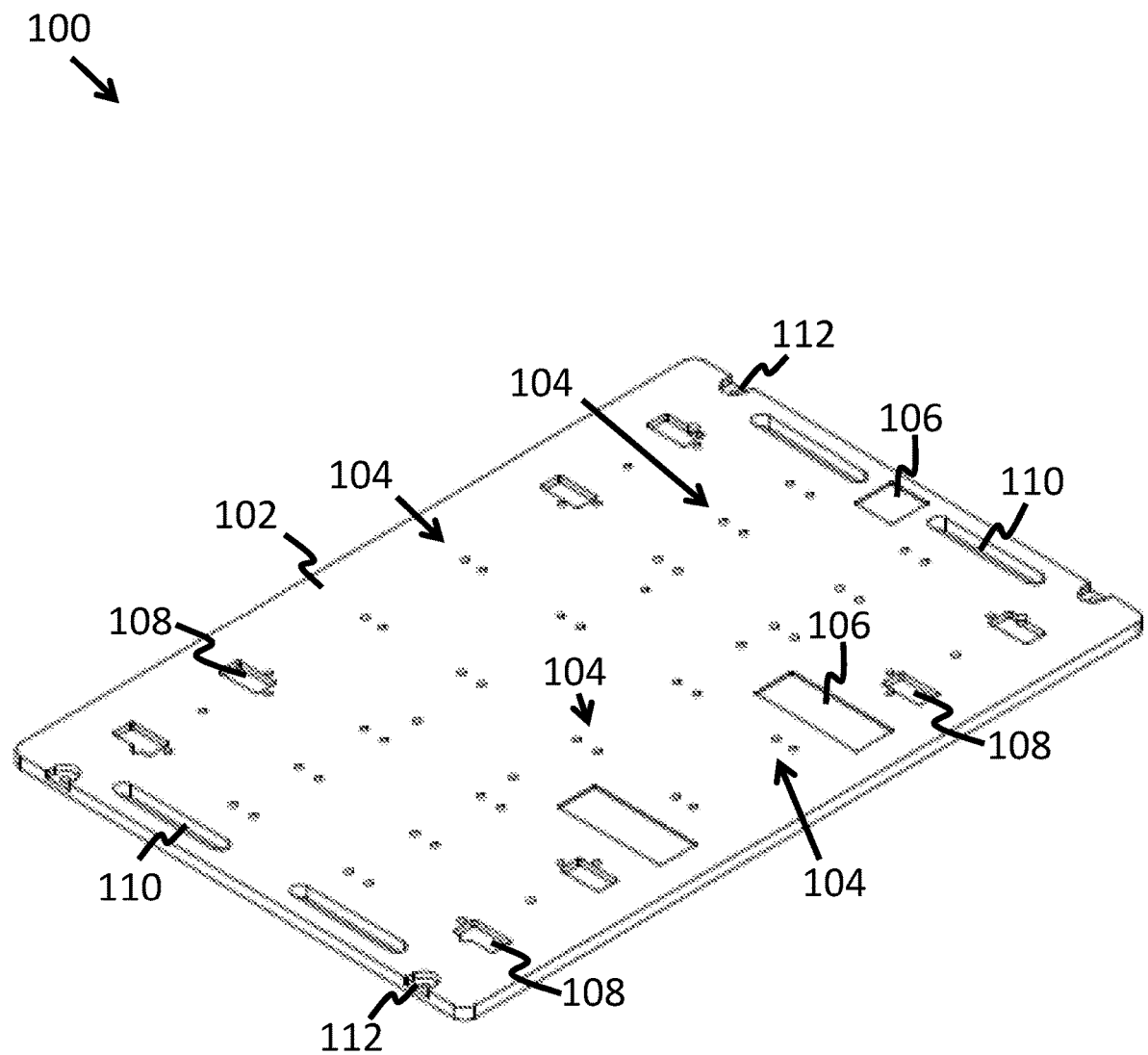
FIG. 1 is a perspective view lustrating one embodiment of a breadboard of the present disclosure.

It should be noted that while the example embodiments depicted in the Figures are to scale, the disclosure is not limited to such embodiments, and the disclosure encompasses embodiments that may include scales or proportions other than those shown in the Figures.

DETAILED DESCRIPTION

Reference will now be made in detail to exemplary embodiments of the invention, some aspects of which are illustrated in the accompanying drawings.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the claims. Furthermore, there is no intention to be bound by any expressed or implied theory presented in the preceding technical field, background, summary, or the following detailed description.

In the drawings, not all reference numbers are included in each drawing, for the sake of clarity. In addition, positional terms such as "upper," "lower," "side," "top," "bottom," etc. refer to the system or components thereof when in the orientation shown in the drawing. A person of skill in the art will recognize that the system can assume different orientations when in use.

Reference throughout this specification to "one embodiment," "an embodiment," "another embodiment," or similar language means that a particular feature, structure, or characteristic described in connection with the embodiment is included in at least one embodiment. Thus, appearances of the phrases "in one embodiment," "in an embodiment," "in some embodiments," and similar language throughout this specification may, but do not necessarily, all refer to the same embodiment, but mean "one or more but not necessarily all embodiments" unless expressly specified otherwise.

The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. As used herein, the term "a," "an," or "the" means "one or more" unless otherwise specified. The term "or" means "and/or" unless otherwise specified.

Multiple elements of the same or a similar type may be referred to as "Elements $102(1)$-$(n)$" where n may include a number. Referring to one of the elements as "Element 102" refers to any single element of the Elements $102(1)$-$(n)$. Additionally, referring to different elements "First Elements $102(1)$-$(n)$" and "Second Elements $104(1)$-$(n)$" does not necessarily mean that there must be the same number of First Elements as Second Elements and is equivalent to "First Elements $102(1)$-$(n)$" and "Second Elements $(1)$-$(m)$" where m is a number that may be the same or may be a different number than n.

FIG. 1 depicts one embodiment of a breadboard 100. The breadboard 100 may include a breaker breadboard. The breadboard 100 may include plastics, wood, or other solid materials. The materials may include sufficient thickness to help support the weight of one or more circuit breakers (sometimes referred to herein simply as "breakers") or other material disposable on the breadboard 100. The breadboard may include a board 102. The board 102 may include one or more of the materials discussed above. The board 102 may be sized or shaped in various configurations. For example, a board 102 may include a rectangle shape (including a square shape), an oval shape (including a circle shape), or some other shape. The board 102 may include a substantially flat board. The board 102 may include a top surface (i.e., the surface of the board 102 depicted in FIG. 1). The top surface may include a surface that, in some embodiments, a breaker may mount to. The board 102 may include a bottom surface. The bottom surface may be disposed opposite the bottom surface.

In some embodiments, the breadboard 100 may include one or more openings 104. An opening 104 may be disposed in or on the board 102. An opening 104 may include a threaded opening. An opening 104 may include an aperture in the board 102. In some embodiments, the arrangement or pattern of the one or more openings 104 or one or more threaded inserts may allow one, two, three, four, or more breakers to be mounted on a surface of the board 102 of the breadboard 100. An opening 104 may penetrate at least partially into the board 102, and in some embodiments, may penetrate completely though the height, length, or width or the board 102. For example, the openings 104 may be partially for fully drilled through the board 102. If partially drilled, the depth of the opening 104 may be sufficient to allow the top of a threaded insert to be flush with the top of the board 102 when the threaded insert is installed.

In one embodiment, the breadboard 100 may include one or more types of cutouts. A cutout may include an indentation in a surface of the board 102. A cutout may various shapes, sizes, depths, or other configurations. A cutout may be positioned on the board 102 in various locations such as on an edge of the board 102, spaced away from the edge but still near the edge, spaced away from the edge and near a center portion of the board 102, or in some other position.

In one or more embodiments, a cutout may include a label cutout 106. A label cutout 106 may include a shallow cutout. A label cutout 106 may allow for a label, instructions, or other information to be shown flush with or below a surface of the board 102. The label cutouts 106 may include various depths, shapes, or sizes. For example, as shown in FIG. 1, one label cutout 106 may include a square shape and a second cutout 106 may include a rectangle shape.

In some embodiments, a cutout may include a protrusion nesting cutout 108. A protrusion nesting cutout 108 may include an cutout shaped, sized, and positioned to allow for nesting of a side wall protrusions of a reusable shipping create. The reusable shipping crate may include a crate in a disassembled and empty state. As an example, as depicted in FIG. 1, a protrusion nesting cutout 108 may be disposed near an edge of the board 102 and may include a rectangle shape.

In one or more embodiments, a cutout may include a handle nesting cutout 110. A handle nesting cutout 110 may include a cutout shaped, sized, and positioned to allow for nesting of a side wall handle of a reusable shipping crate. As depicted in FIG. 1, a handle nesting cutout 110, in one embodiment, may be disposed near an edge of the board 102 and may include a long, thin rectangle shape.

In some embodiments, a cutout may include a bolt cutout 112. A bolt cutout 112 may include a cutout shaped, sized, and positioned to allow the breadboard 110 to be bolted to an underlying pallet. A bolt cutout 112 may include an aperture drilled down through the bottom surface of the bolt cutout 112. As an example, in FIG. 1, a bolt cutout 112 may be disposed on an edge of the board and may include a half-circle shape, and the aperture may be disposed in the middle of the bolt cutout 112.

Figure 2:
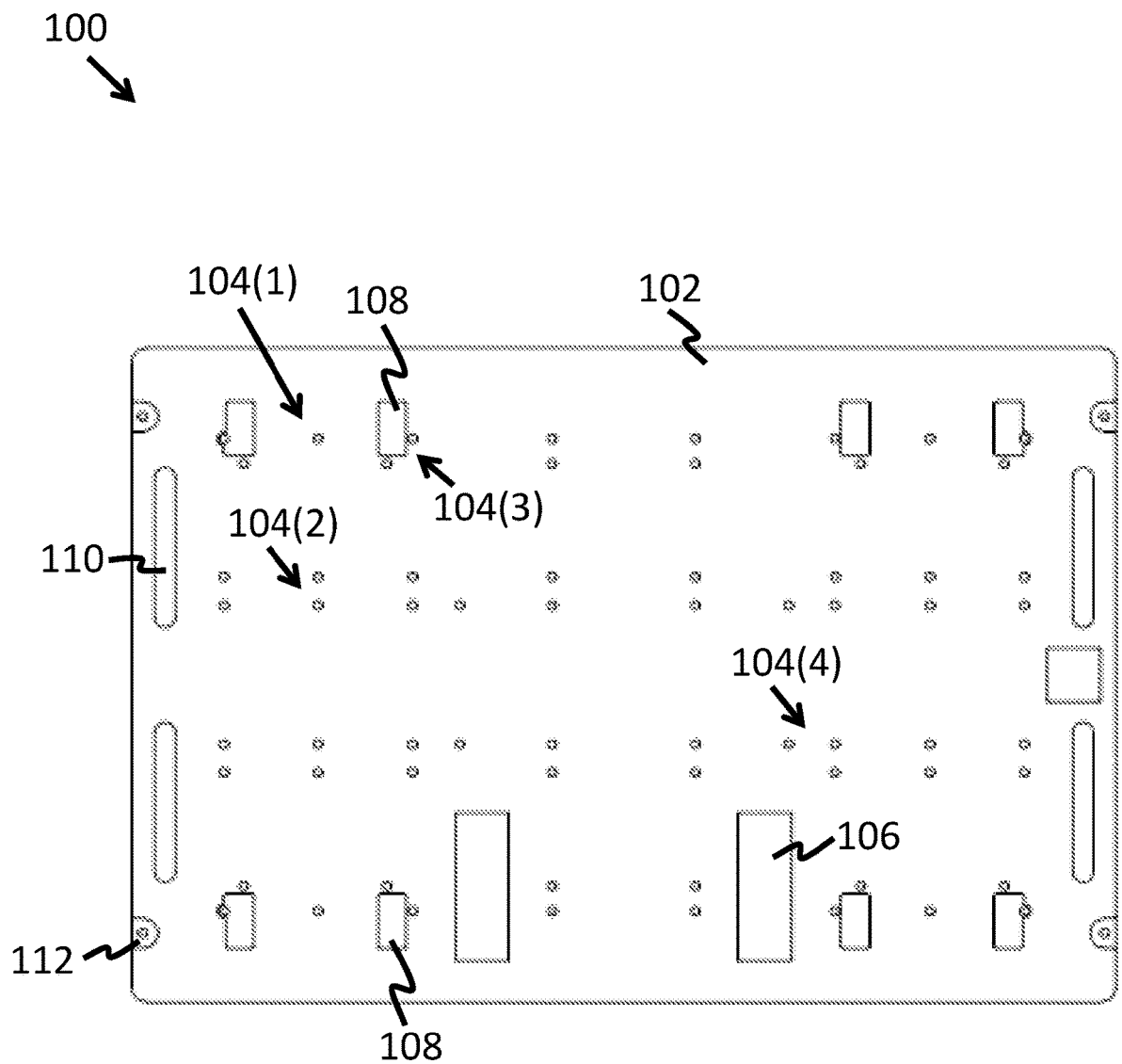
FIG. 2 is a top-down view illustrating another embodiment of the breadboard of FIG. 1, according to the present disclosure.

FIG. 2 depicts the breadboard 100. The breadboard 100 may include some of the components discussed above in relation to FIG. 1 (e.g. the board 102, the one or more openings 104, the one or more cutouts 106, 108, 110, and 112). In addition to showing the cutouts 106, 108, 110, 112 for nesting described in FIG. 1, FIG. 2 shows one embodiment of a pattern of openings 104. One or more of the openings 104 may be drilled and tapped with threaded inserts.

In some embodiments, the one or more openings 104 may be arranged on the board 102 in groups of one, two, or three openings 104. For example, as depicted in FIG. 1 a first group of openings 104(1) may include a single opening 104. A second group openings 104(2) may include two openings 104. The two openings 104 may be arranged in a line parallel to an edge of the board 102. A third group of openings 104(3) may include two openings 104 that may be disposed on the board 102 near edges of a protrusion nesting cutout 108. A fourth group of openings 104(4) may include three openings 104 that may be arranged in an "L" shape such that the two lines formed by the openings 104 are parallel to different edges of the board 102. In some embodiments, a group of openings 104 may include four or more openings 104. In one embodiment, the groups of openings 104 may include other arrangements, shapes, or configurations than those discussed above.

In some embodiments, the openings 104 may be arranged on the board 102 in a pattern. For example, as depicted in FIG. 2, multiple groups of openings 104 may be laid out in a row. For example, a row of openings 104 (including the group 104(2)) may be laid out from left to right (as viewed in FIG. 2). In another example, as shown in FIG. 2, multiple groups of openings 104 (including the group 104(4)) may be laid out in columns from top to bottom (as viewed in FIG. 2). In some embodiments, a row or column of openings 104 may be disposed in a line, and the line may be parallel to a side of the board 102.

In some embodiments, one or more rows and one or more columns of groups of openings 104 may be laid out in a grid pattern. The groups of openings 104 may be spaced from each other. The pattern of the groups of openings 104 may be arranged to allow different configurations of one or more breakers to be attached to, mounted on, or otherwise disposed on the breadboard 100. For example, a breaker may include a flange disposed on a side of the breaker. In some embodiments, a breaker may include a single flange, two flanges (which may be disposed on opposites sides of the breaker or on adjacent sides), three flanges, four flanges (one on each side of the breaker), or more flanges. Each flange may include more than one aperture in it. As an example, a single breaker with two flanges and two apertures in each flange may be disposed on the breadboard 100 by the placement of four openings 104 in the breadboard 100 with the same spacing and spatial location as the ones on the flange. By way of another example, multiple breakers using the same flange layout can be disposed on the breadboard 100 by providing multiple opening 104 groups with identical spacing to the apertures in the flanges. The base of the breakers may be configured in a rectangular shape or other shape. The openings 104 in the breadboard 100 may match the apertures in the flange and may be arranged with a longer side of the breaker based either parallel to a longer side of the breadboard 100 or with a longer side of the breaker parallel to a short side of the breadboard 100.

In some embodiments, a breaker may include a substantially rectangular prism shape. In other embodiments, a breaker may include another shape. As used herein, the term "breaker" may refer to a container that includes the breaker. For example, in some embodiments, the breaker itself may not include a flange (as discussed above), but a container including the breaker may include the flange.

Figure 3:
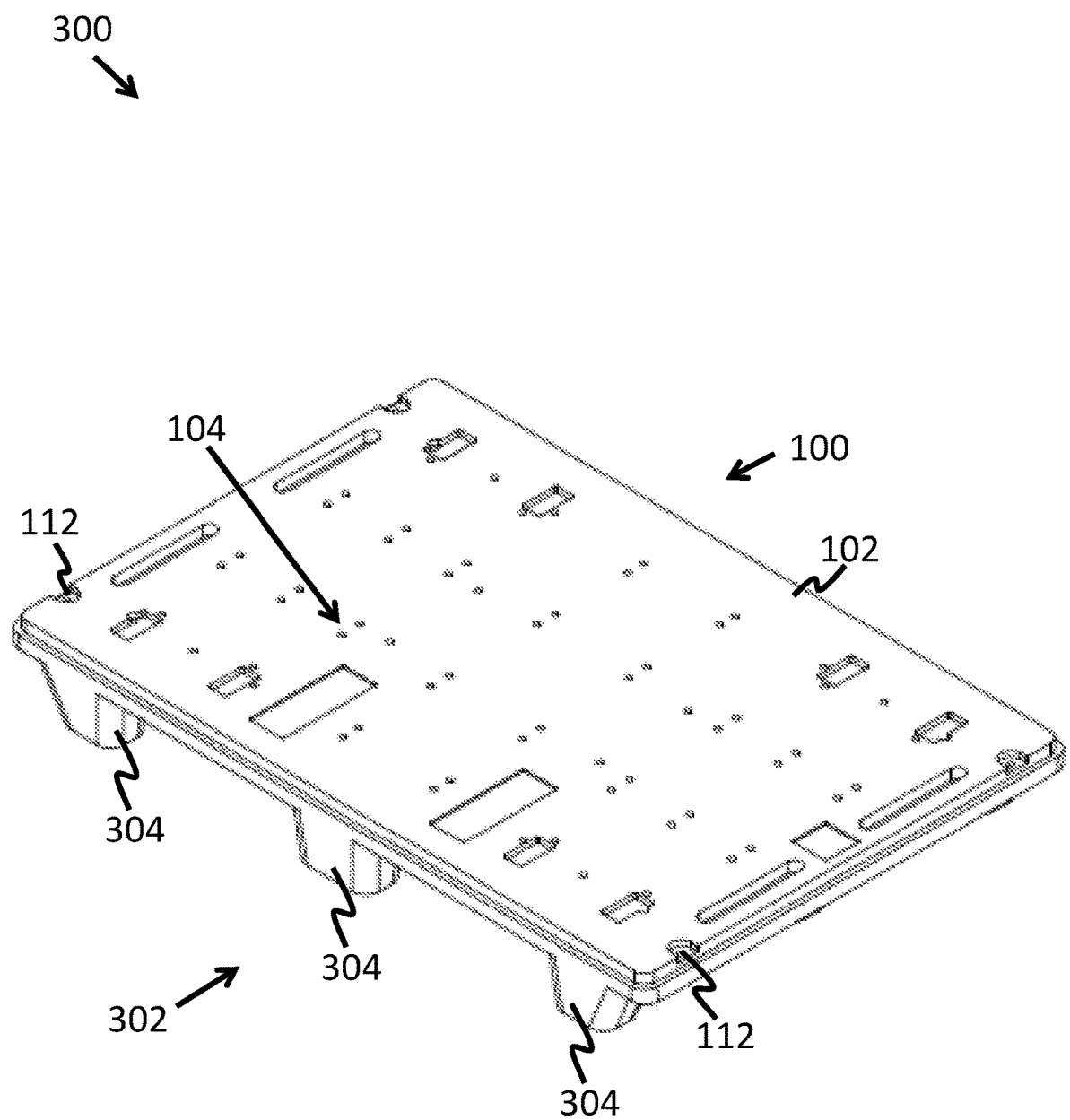
FIG. 3 is a perspective view illustrating one embodiment of a system that includes a breadboard mounted on a pallet, according to the present disclosure.

FIG. 3 depicts one embodiment of a system 300. The system 300 may include the breadboard 100. The system 300 may include a pallet 302. The breadboard 100 may be mounted on the pallet 302. The breadboard 100 may be mechanically mounted via hardware or other bonding connection on the pallet 302. The pallet 302 may include plastic, wood, or other suitably strong material. In some embodiments, the pallet 302 may include a top surface. The top surface may include a surface on which the bottom surface of the board 102 of the breadboard 100 is mounted or otherwise disposed. The pallet 302 may include a bottom portion. The bottom portion may be disposed opposite the top surface of the pallet 302.

In one embodiment, the pallet 302 may include one or more risers 304. The risers 304 may be disposed on the bottom portion of the pallet 302. The risers may extend in an opposite direction of the top surface of the pallet 302. As an example, as depicted in the example embodiment of FIG. 3, the pallet 302 may include six risers 304 (three of which may not be viewable in FIG. 3). The risers 304 may lift the top surface of the pallet 302 off the ground and may allow the pallet 302 to support the breadboard 100 (and anything disposed on the breadboard 100, such as a breaker) while being placed on a surface or being lifted (e.g., by a forklift or other lifting or transporting device). In some embodiments, the pallet 302 may include one or more runners. The one or more runners 302 may span a length of a long side or a short side of the pallet 302.

As shown in FIG. 3, in one or more embodiments, the breadboard 100 may be connected to the pallet 302 by placing a bolt through an opening 104 or a bolt cutout 112 in the breadboard 100 and threading the bolt into a threaded insert that disposed in the pallet's 302 surface. Connecting the breadboard 100 to the pallet 302 may allow the breadboard 100 to be moved more easily by a forklift or a pallet jack. The pallet 302 may also be used as a transport medium for the breadboard 100 if it is being utilized in a manufacturing process. In one embodiment, the breadboard 100 and the pallet 302 may be integral with each other and form a single piece.

Figure 4A:
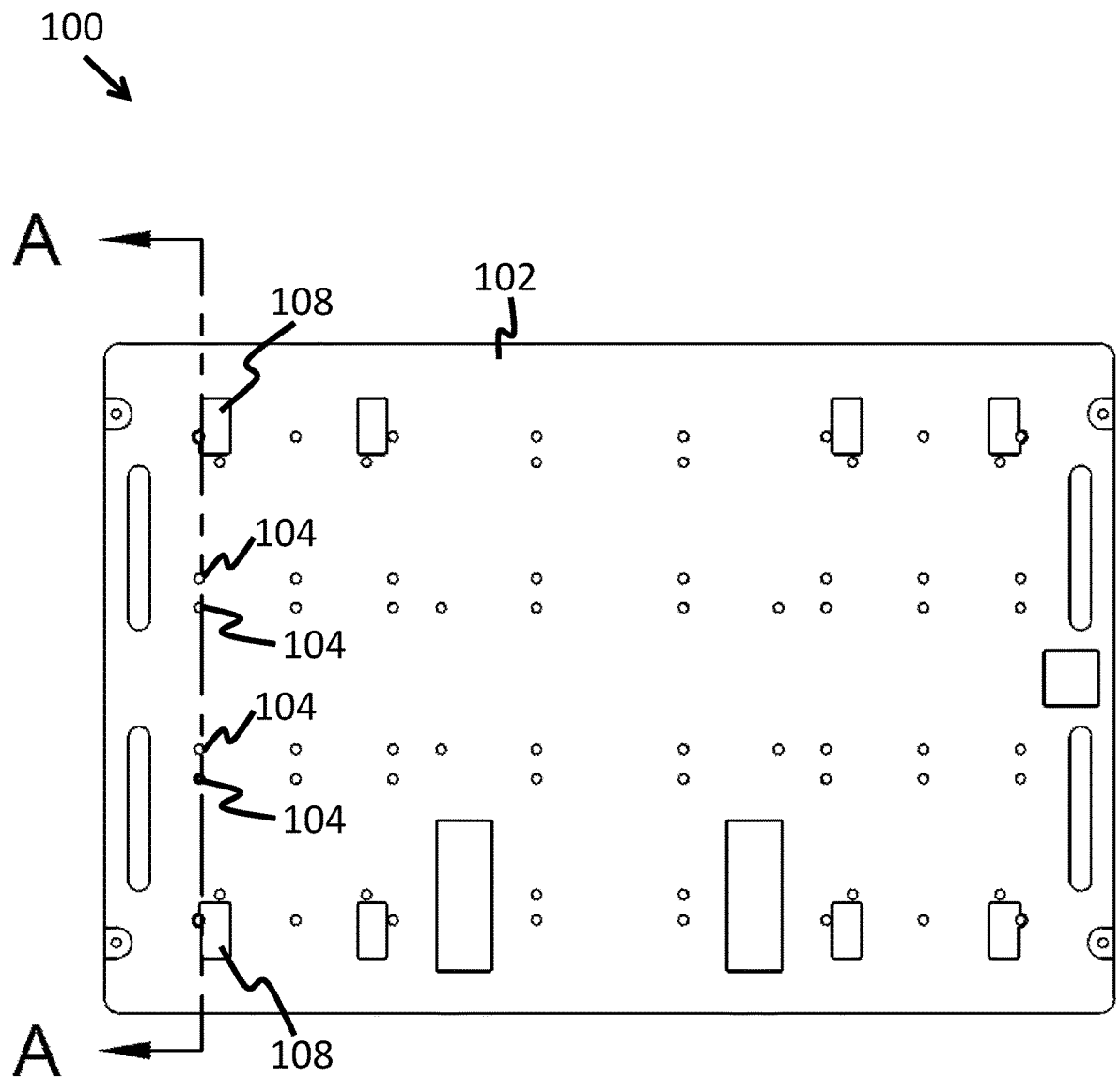
FIG. 4A is a top-down view illustrating an embodiment the breadboard of FIG. 1.
Figure 4B:
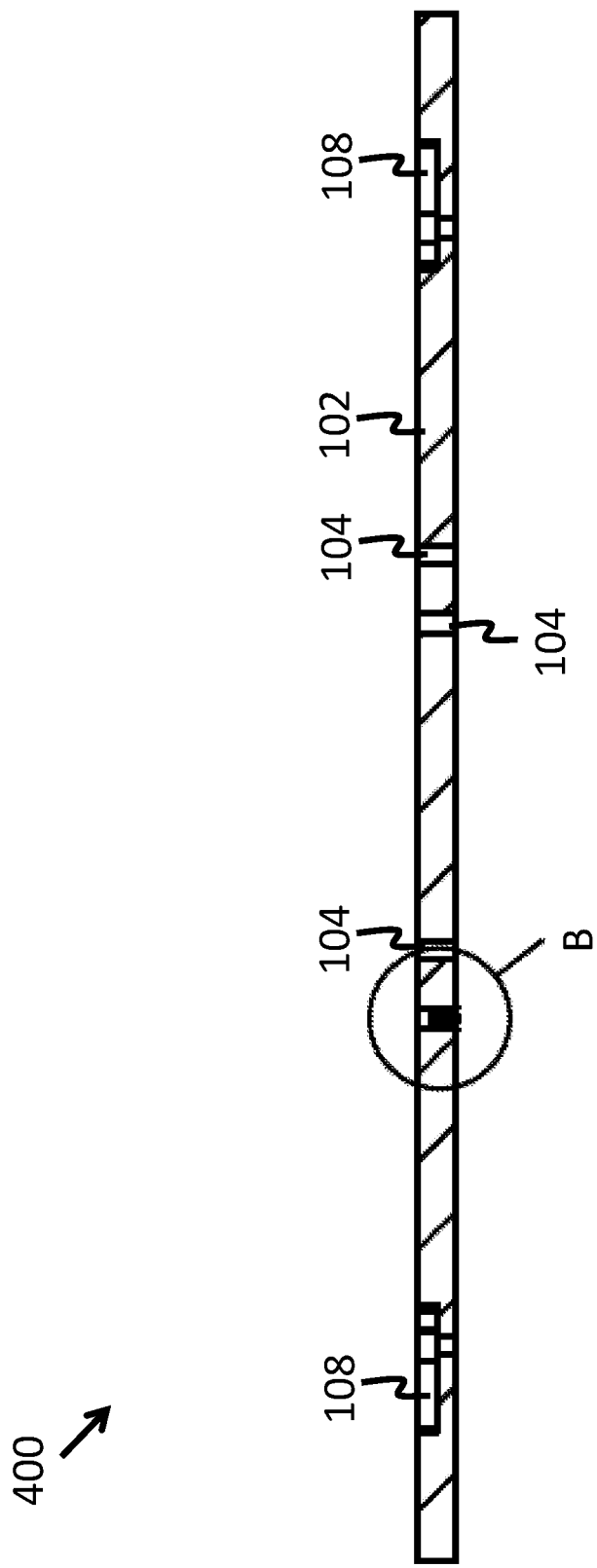
FIG. 4B is a cutaway side view illustrating one embodiment of the breadboard of FIG. 4A cutaway along the line A of FIG. 4A.
Figure 4C:
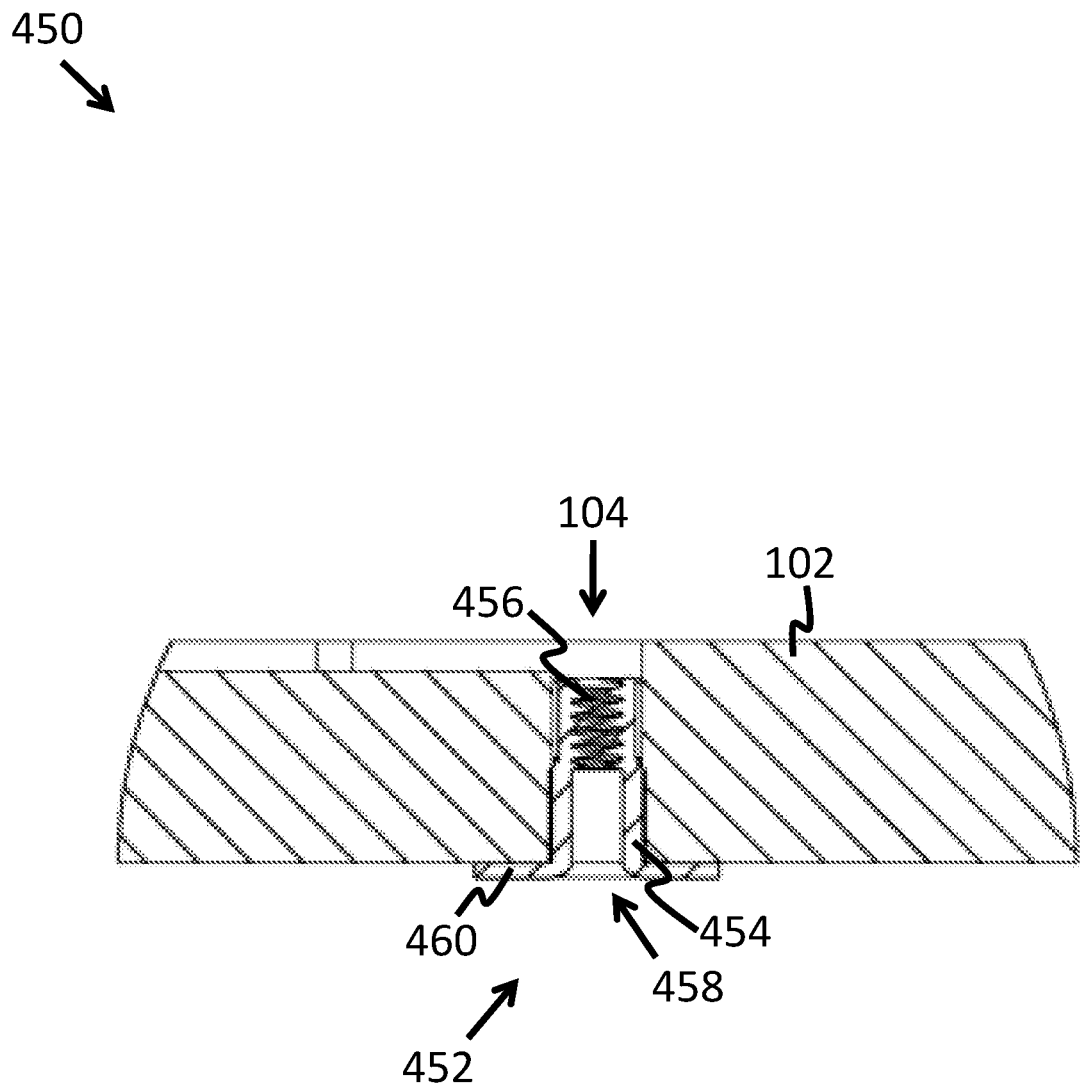
FIG. 4C is a cutaway side view illustrating one embodiment of a threaded insert inserted into the breadboard of FIG. 4B, according to the present disclosure.

FIG. 4A depicts one embodiment of the breadboard 100. The breadboard 100 may include one or more components of the breadboard 100 of FIGS. 1-3. FIG. 4B depicts a cross section 400 of the breadboard 100 through Section A-A of FIG. 4A and shows the board 102, multiple openings 104, and multiple protrusion nesting cutouts 108. FIG. 4C depicts one embodiment of an enlarged cross section 450 of the cross section 400 of FIG. 4B labeled "B." FIG. 4C depicts one embodiment of a threaded insert 452. The threaded insert 452 may be disposed in the board 102 of the breadboard 100. The threaded insert 452 may be inserted, for example, into an opening 104 of the board 102 from the top or bottom. The threaded insert 452 may include a body 454. The body 454 may be threaded and may be sized or shaped to receive the threaded portion 456 of a bolt 458. The threaded insert 452 may include a flange 460. The flange 460 may be disposed on the body 454 and may prevent the threaded insert 452 from being inserted too far into the opening 104. In some embodiments, the length of the threaded portion 456 may be sufficient to allow the threads of the bolt 458 to engage with the threaded portion 456

Figure 5A:
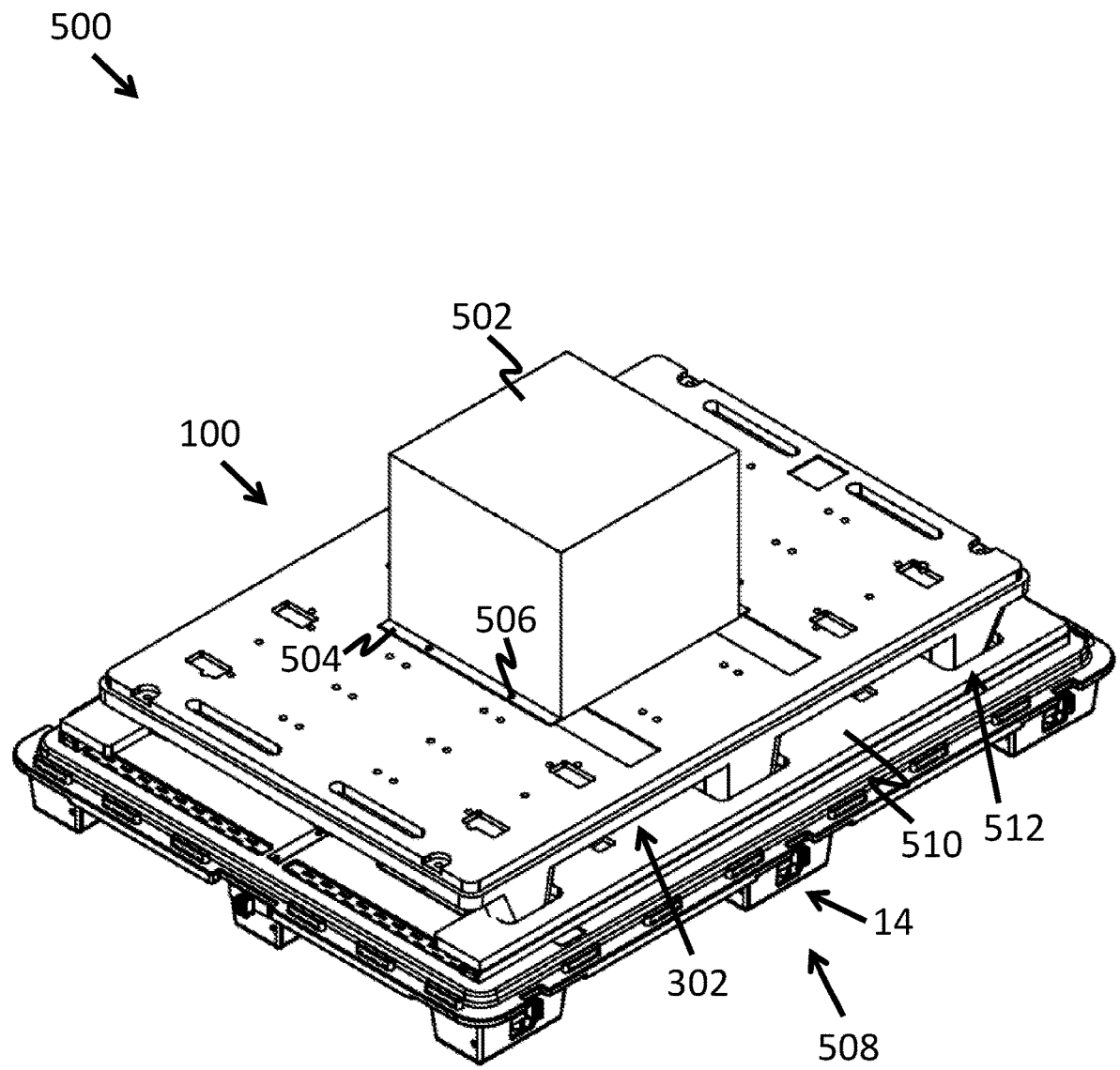
FIG. 5A is a perspective view illustrating one embodiment of a system for reusable shipping platform for transporting multiple electrical circuit breakers, according to the present disclosure.

FIG. 5A depicts one embodiment of a system 500. The system 500 may include a pallet 302 and a breadboard 100 mounted to the pallet 302, which may be similar to the system 300 of FIG. 3. As depicted in FIG. 5A, the system 500 may include an application for use of the breadboard 100 and pallet 302 system 300 as it may be utilized in conjunction with a modular reusable shipping create as described in U.S. patent application Ser. No. 17/001,603, which is incorporated by reference.

The system 500 may include a breaker 502. The breaker 502 may include a three-pole breaker. The breaker 502 may be disposed on the breadboard 100. The breaker 502 may mount to the breadboard 100 with one or more bolts that may pass through one or more flanges 504. The one or more flanges 504 may be disposed on one or more sides of the breaker 502. For example, as depicted in FIG. 5A, the breaker 502 may include two flanges 504 that may be disposed on opposite sides of the breaker 502 from each other. As is depicted in FIG. 5A, a flange 504 may include one or more apertures 506 through which a bolt may pass before it is screwed into an opening 104 or threaded insert 452 in the breadboard 100.

Figure 5B:
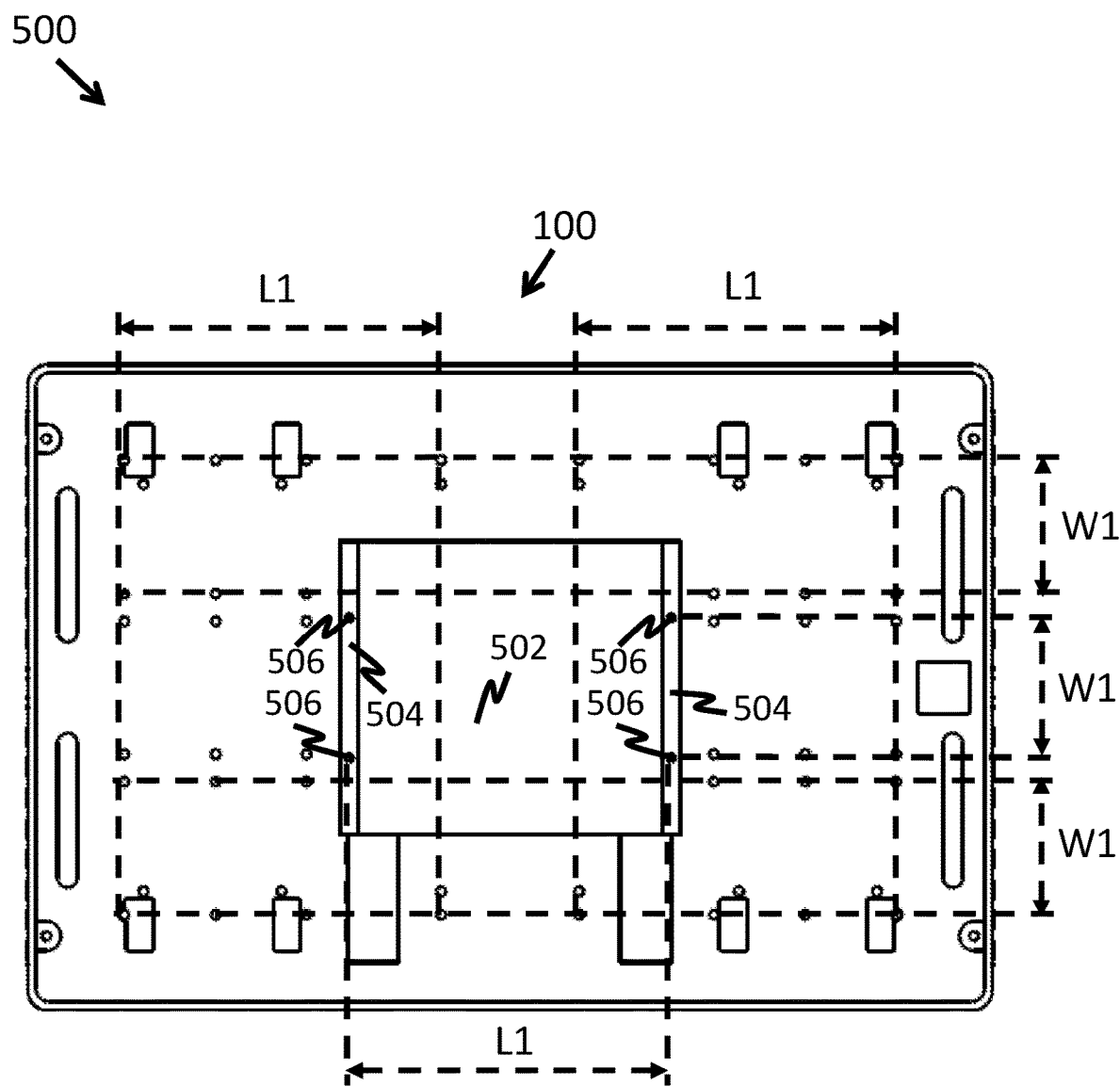
FIG. 5B is a top-down view illustrating one embodiment of the breadboard of FIG. 5A, according to the present disclosure.

FIG. 5B depicts the system 500 with the breadboard 100 and the breaker 502 disposed on the breadboard 100. In one embodiment, the distance between the apertures 506 in opposing flanges 504 on the same side of the breaker 502 may be configured with a length "L1". As shown, a spacing for groups of openings 104 on the length of the breadboard 100 may include the length "L1" such that one breaker 502 may be disposed in the center of the breadboard 100. The distance between the apertures 506 on a single flange 504 may be configured as shown on the distance "W1". As shown, the spacing for sets of openings 104 on the width of the breadboard 100 may include the length "W1" such that one breaker 502 can be placed in the center of the breadboard 100. Additionally or alternatively, the breadboard 100 may be configured to include openings 104 spacings of "L1" and "W1" such that two breakers 502 may be disposed at each end along the center line or four breakers 502 may be disposed with one in each quadrant of the breadboard 100.

Returning to FIG. 5A, in some embodiments, in transport, the breadboard 100 and pallet 302 may be conveyed inside an outer container 508. The outer container 508 may include a secondary pallet base 510. The breadboard 100 and the pallet 302 may be disposed on the secondary pallet base 510 for protection of contents during the transport cycle. The pallet 302 may be disposed on the secondary pallet base 510 via a saddle 512 of a fit designed nesting system of the outer container 508. A riser 304 or a runner of the pallet 302 may be disposable in a saddle 512, and the saddle 512 may hold the pallet 302 in place to prevent movement in the X, Y, or Z axis. On receipt, the breadboard 100 or pallet 302 may be removable from the outer container 508 or the secondary pallet base 510 via forklift or other lift mechanism. The breadboard 100 or pallet 302 may be stored on standard warehouse shelving or other open space. The breadboard 100 may be reusable through its life cycle.

Figure 6A:
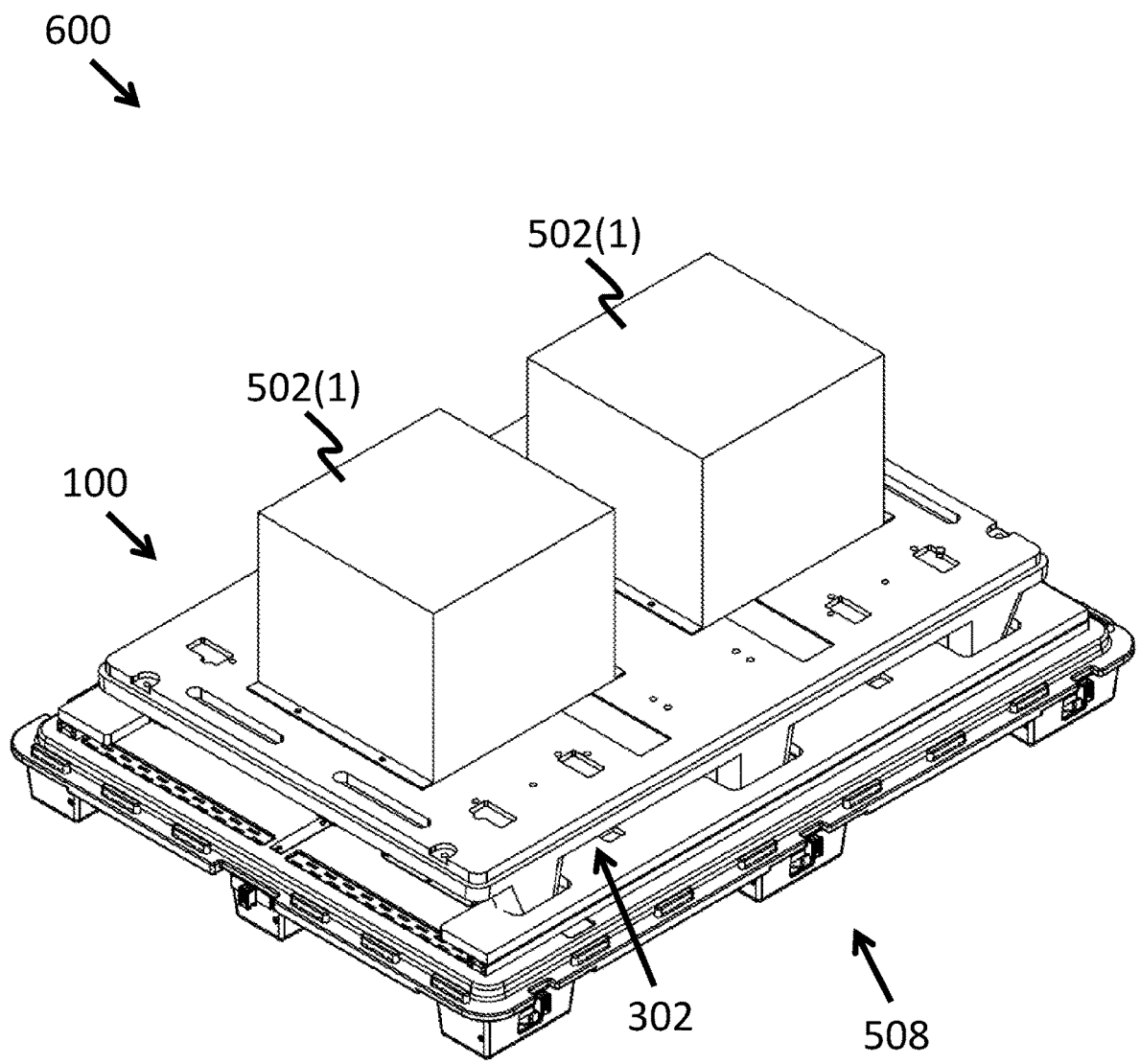
FIG. 6A is a perspective view illustrating one embodiment of a system for reusable shipping platform for transporting multiple electrical circuit breakers, according to the present disclosure.
Figure 6B:
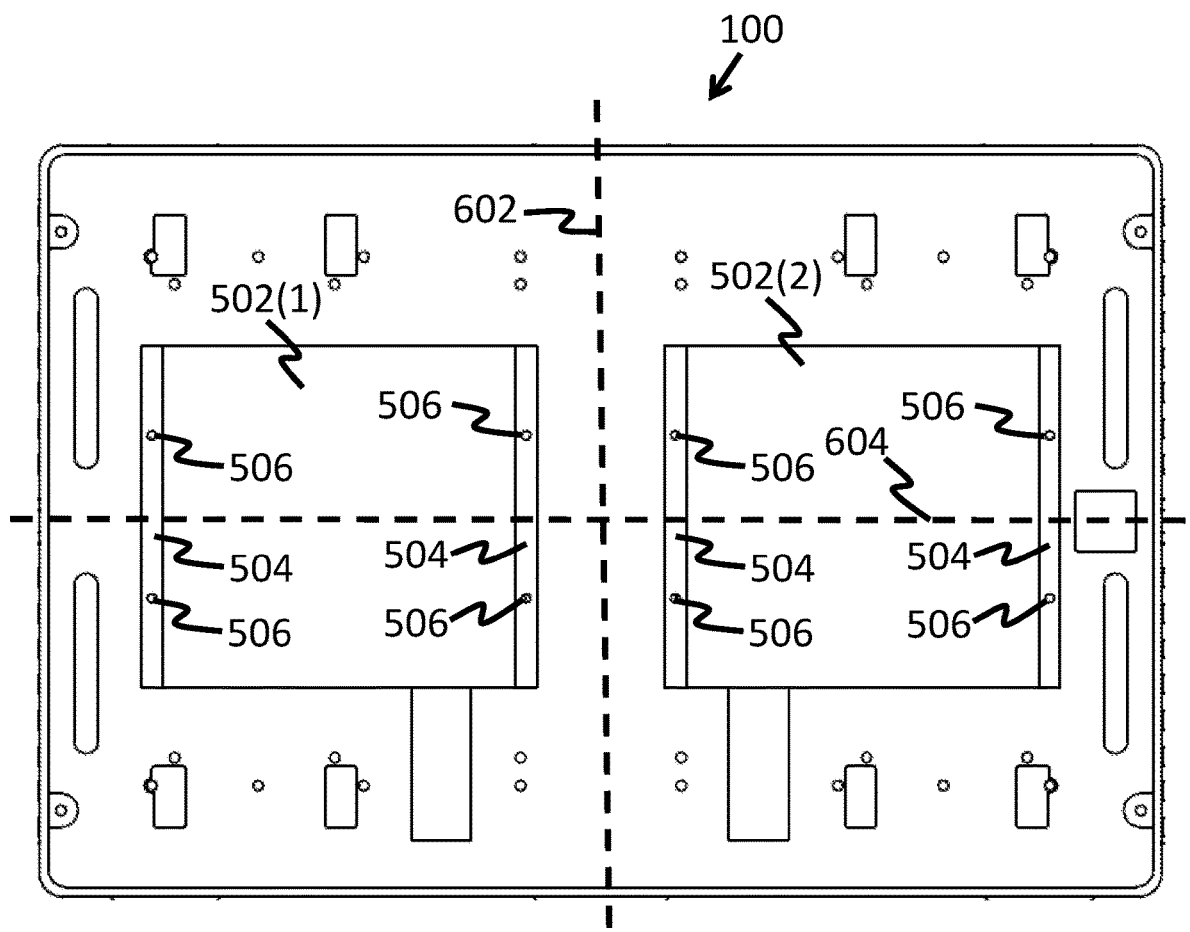
FIG. 6B is a top-down view illustrating one embodiment of the breadboard of FIG. 6A, according to the present disclosure.

FIG. 6A depicts one embodiment of a system 600. The system 600 may include the breadboard 100, the pallet 302, and the outer container 508. The system 600 may include two breakers 502(1)-(2). The breakers 502(1)-(2) may be disposed on the breadboard 100. The two breakers 502(1)-(2) may each include a three-pole breaker. FIG. 6B depicts the breadboard 100 with the two breakers 502(1)-(2) disposed on the breadboard 100 as depicted in FIG. 6A. As can be seen in FIG. 6B, the breakers 502(1)-(2) may be disposed on the breadboard 100 to allow the breakers 502(1)-(2) to be balanced about a lateral center line 602 and a longitudinal center line 604 for equal weight distribution on both a long dimension and a short dimension the breadboard 100, respectively. The apertures 506 of the flanges 504 of each of the breakers 502(1)-(2) may be disposed to align with some of the openings 104 of the breadboard 100 to achieve this balance and weight distribution.

Figure 7A:
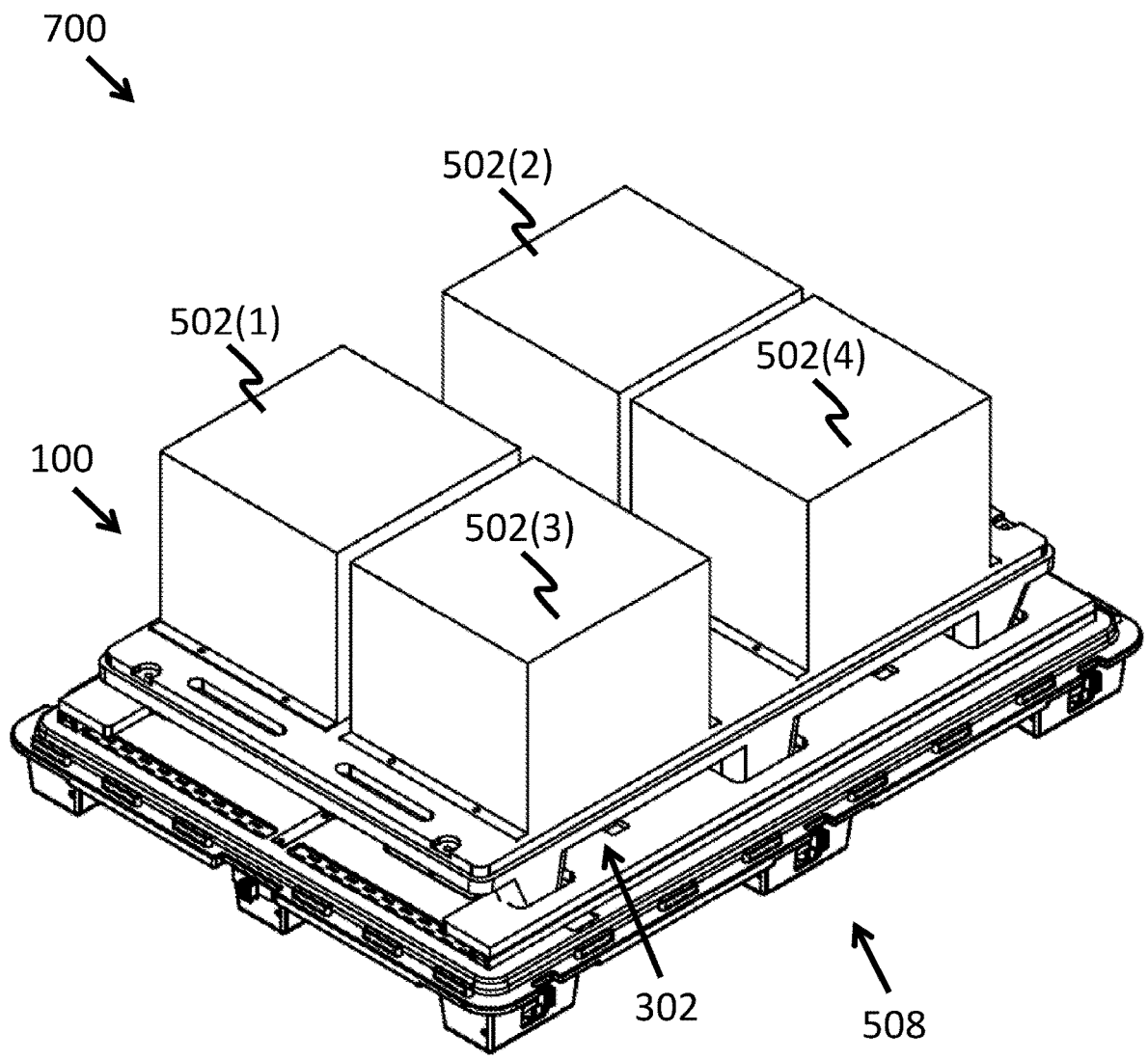
FIG. 7A is a perspective view illustrating one embodiment of a system for reusable shipping platform for transporting multiple electrical circuit breakers, according to the present disclosure.
Figure 7B:
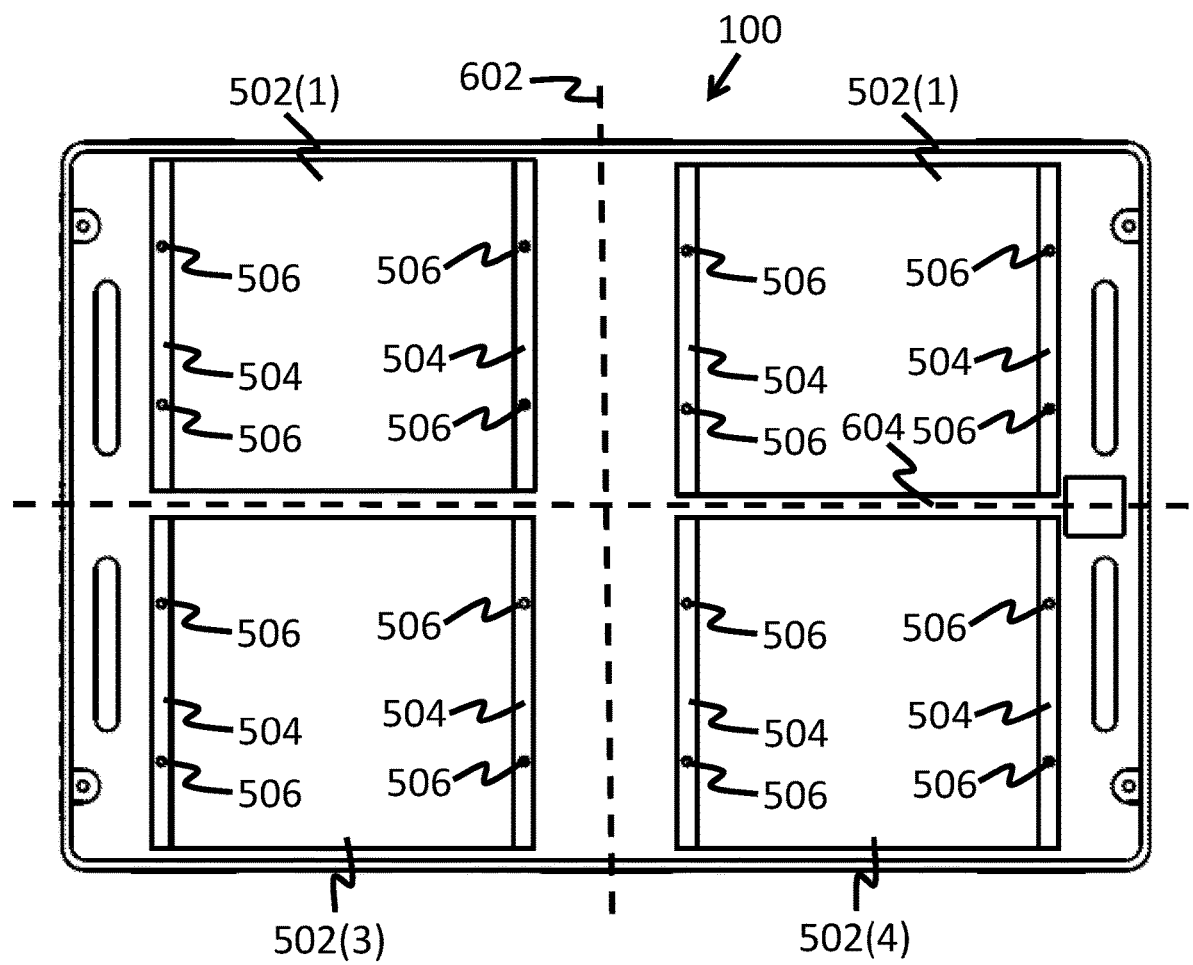
FIG. 7B is a top-down view illustrating one embodiment of the breadboard of FIG. 7A, according to the present disclosure.

FIG. 7A depicts one embodiment of a system 700. The system 700 may include the breadboard 100, the pallet 302, and the outer container 508. The system 700 may include four breakers 502(1'44). The breakers 502(1)-(4) may be disposed on the breadboard 100. The breakers 502(1)-(4) may each include a three-pole breaker. FIG. 7B depicts the breadboard 100 with the four breakers 502(1)-(4) disposed on the breadboard 100 as depicted in FIG. 7A. As can be seen in FIG. 7B, the breakers 502(1)-(4) may be disposed on the breadboard 100 to allow the breakers 502(1)-(4) to be balanced about a lateral center line 602 and a longitudinal center line 604 for equal weight distribution on both a long dimension and a short dimension the breadboard 100, respectively. The apertures 506 of the flanges 504 of each of the breakers 502(1)-(4) may be disposed to align with some of the openings 104 of the breadboard 100 to achieve this balance and weight distribution.

Figure 8A:
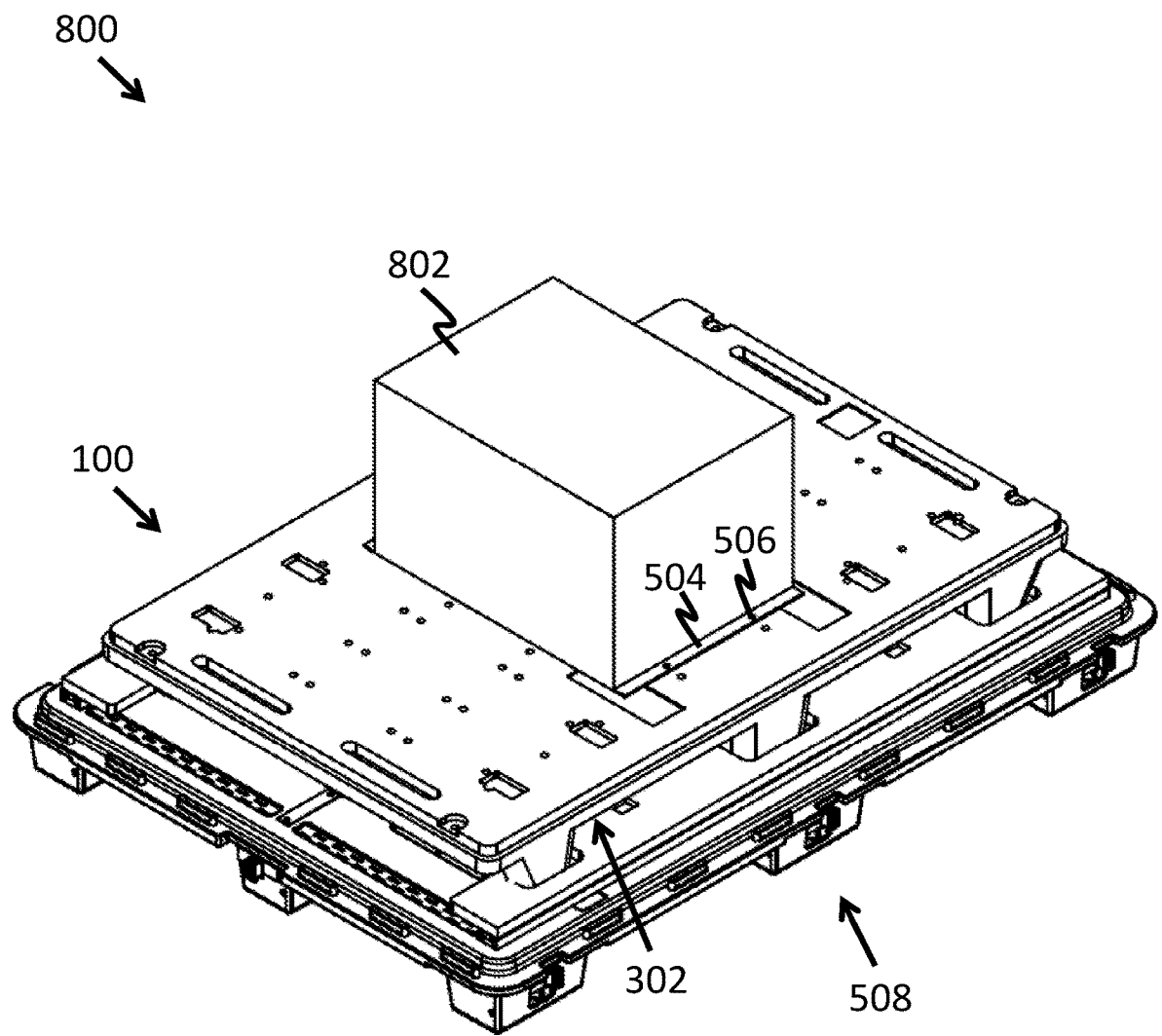
FIG. 8A is a perspective view illustrating one embodiment of a system for reusable shipping platform for transporting multiple electrical circuit breakers, according to the present disclosure.

FIG. 8A depicts one embodiment of a system 800. The system 800 may include the breadboard 100, the pallet 302, and the outer container 508. The system 800 may include a breaker 802. The breaker 802 may include a four-pole breaker. The breaker 802 may be disposed on the breadboard 100. The breaker 802 may mount to the breadboard 100 with one or more bolts that may pass through one or more flanges 504 of the breaker 802. The one or more flanges 504 may be disposed on one or more sides of the breaker 802. For example, as depicted in FIG. 8A, the breaker 802 may include two flanges 504 that may be disposed on opposite sides of the breaker 802 from each other. As is depicted in FIG. 8A, a flange 504 may include one or more apertures 506 through which a bolt may pass before it is screwed into an opening 104 or threaded insert 452 in the breadboard 100.

Figure 8B:
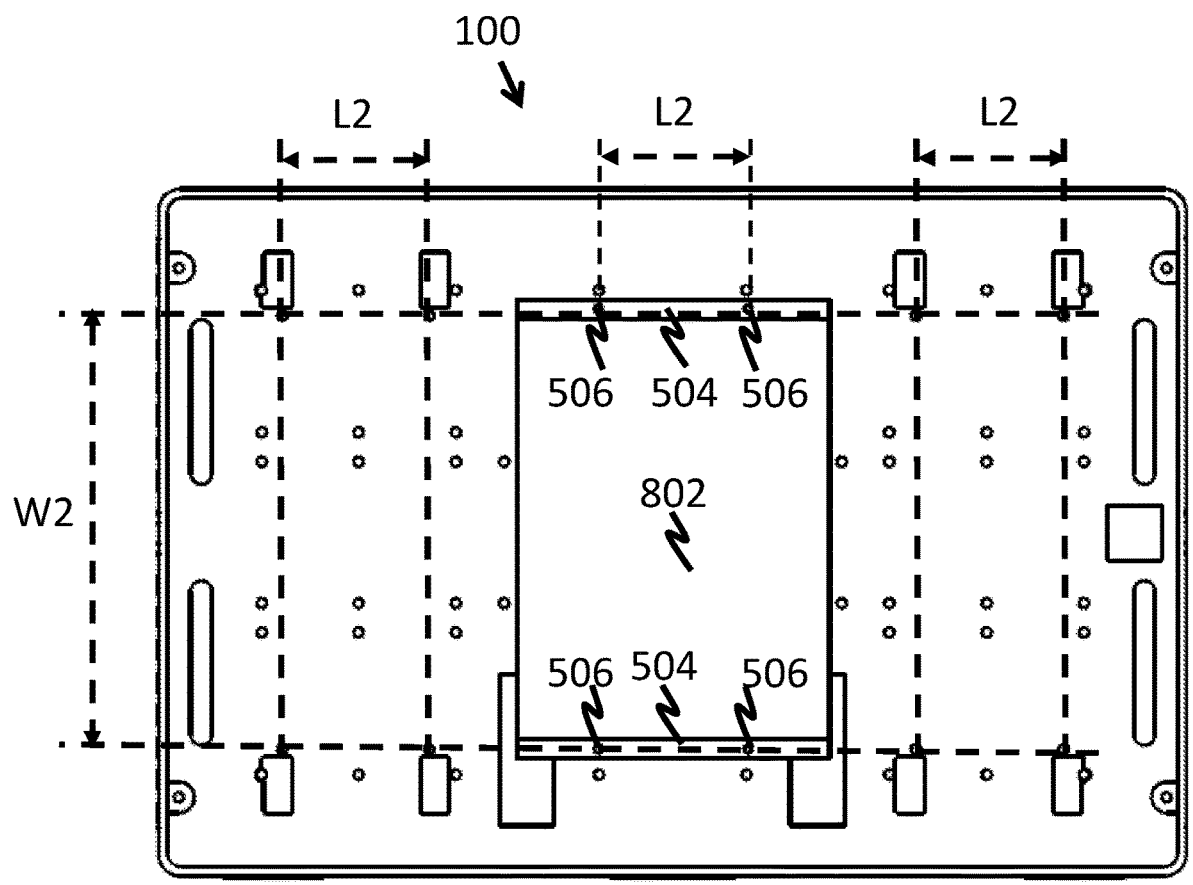
FIG. 8B is a top-down view illustrating one embodiment of the breadboard of FIG. 8A, according to the present disclosure.

FIG. 8B depicts one embodiment of the breaker 802 disposed on the breadboard 100 as depicted in FIG. 8A. In some embodiments, one or more openings 104 of the breadboard 100 may be laid out on the breadboard 100 to allow a single breaker 802 to be balanced about center lines for equal weight distribution on long and short dimensions of the breadboard 100. In one embodiment, the distance between the apertures 506 in opposing flanges 504 may include the length "W2." As shown in FIG. 8B, in one or more embodiments, the spacing for sets of apertures 506 may be "W2" such that the breaker 802 may be disposed in the center of the breadboard 100. The distance between the apertures 506 on a single flange 504 of the breaker may be "L2." As shown in FIG. 8B, the spacing for one or more openings 104 on a width of the breadboard 100 may include "W2" such that one breaker 802 can be placed in the center.

Figure 9:
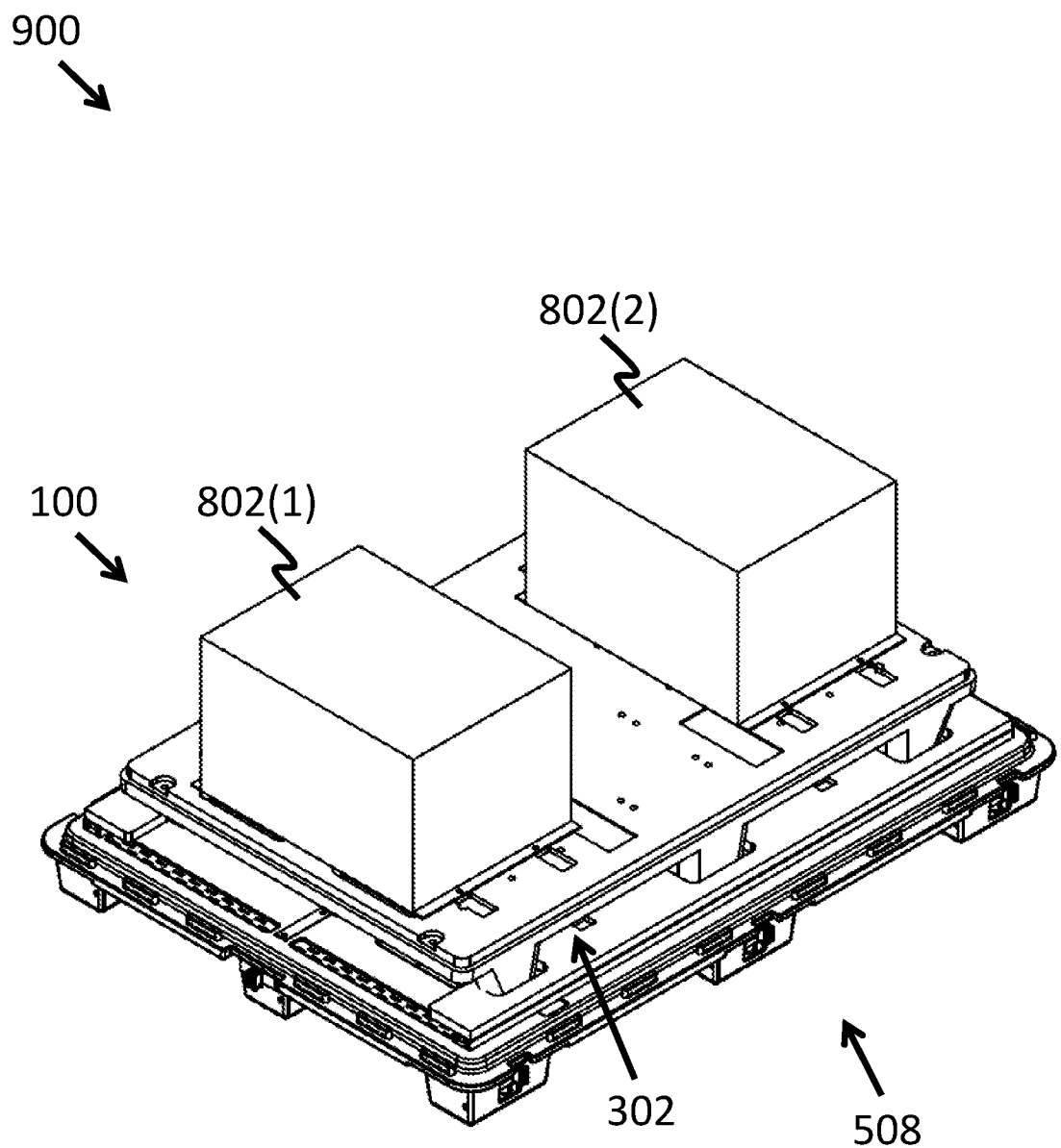
FIG. 9 is a perspective view illustrating one embodiment of a system for reusable shipping platform for transporting multiple electrical circuit breakers, according to the present disclosure.

FIG. 9 depicts one embodiment of a system 900. The system 900 may include the breadboard 100, the pallet 302, and the outer container 508. The system 900 may include two breakers 802(1)-(2). The breakers 802(1)-(2) may each include a four-pole breaker. The breakers 802(1)-(2) may be disposed on the breadboard 100. For example, as depicted in FIG. 9, the breadboard 100 may include one or more openings 104 whose spacing may include "L2" or "W2" such that the two breakers 802(1)-(2) may be disposed at each narrower end of the breadboard 100.

Figure 10:
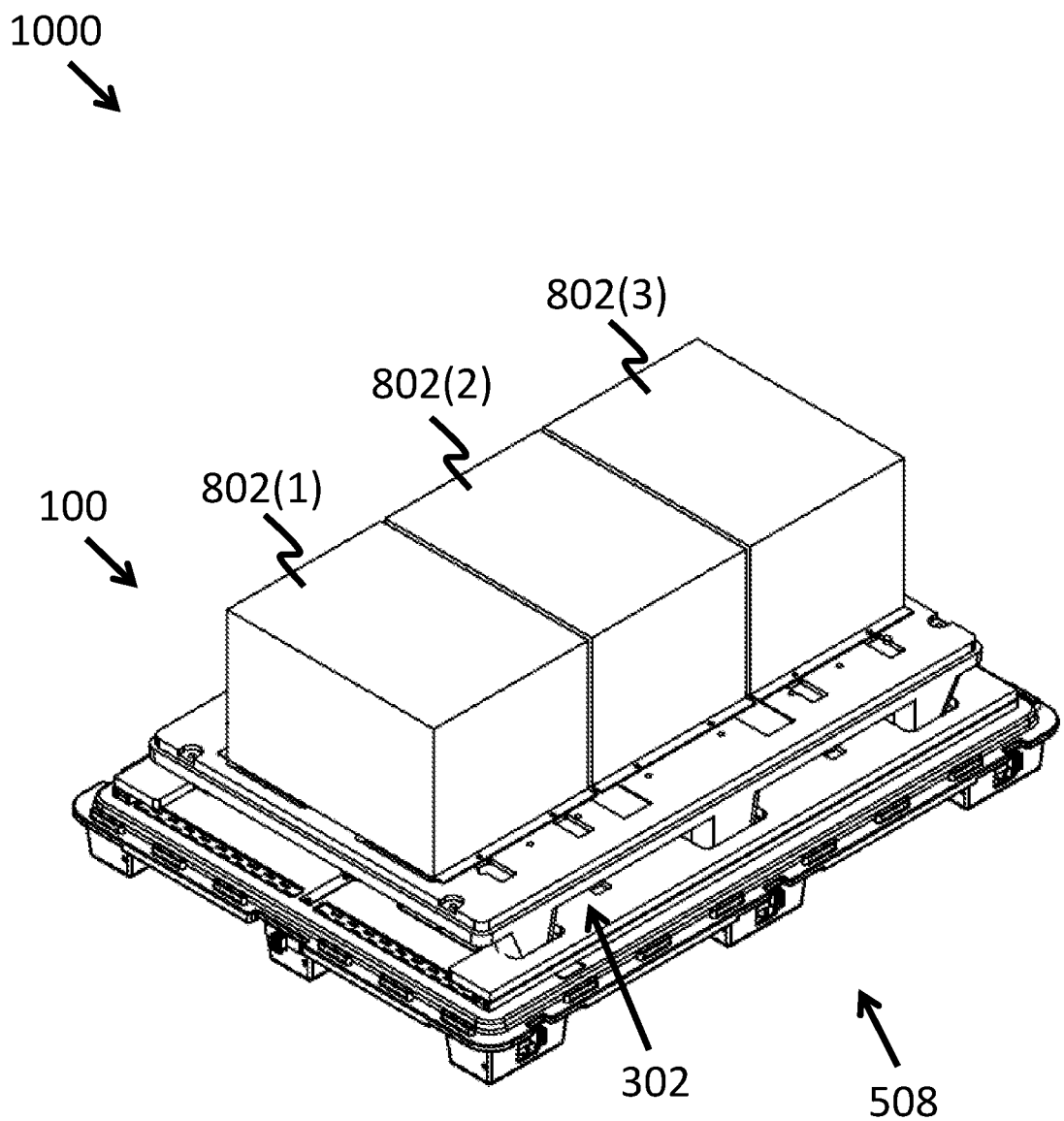
FIG. 10 is a perspective view illustrating one embodiment of a system for reusable shipping platform for transporting multiple electrical circuit breakers, according to the present disclosure.

FIG. 10 depicts one embodiment of a system 1000. The system 1000 may include the breadboard 100, the pallet 302, and the outer container 508. The system 1000 may include three breakers 802(1)-(3). The breakers 802(1)-(3) may each include a four-pole breaker. The breakers 802(1)-(3) may be disposed on the breadboard 100. For example, as depicted in FIG. 10, the breadboard 100 may include one or more openings 104 whose spacing may include "L2" or "W2" such that the three breakers 802(1)-(3) may be disposed side-by-side with a long side of the breakers 802(1)-(3) perpendicular to a long side (e.g., a length) of the breadboard 100.

In some embodiments, each of the systems 800, 900, and 1000 of FIGS. 8A, 8B, 9, and 10 may have the one or more breakers 802(1)-(n) (where n is the number of breakers 802) disposed on the breadboard 100 and laid out to allow the placement of the breakers 802(1)-(n) to be balanced about a center line for equal weight distribution on a long or short dimensions of the breadboard 100, similar to the center lines 602, 604 of FIGS. 6B and 7B.

Figure 11A:
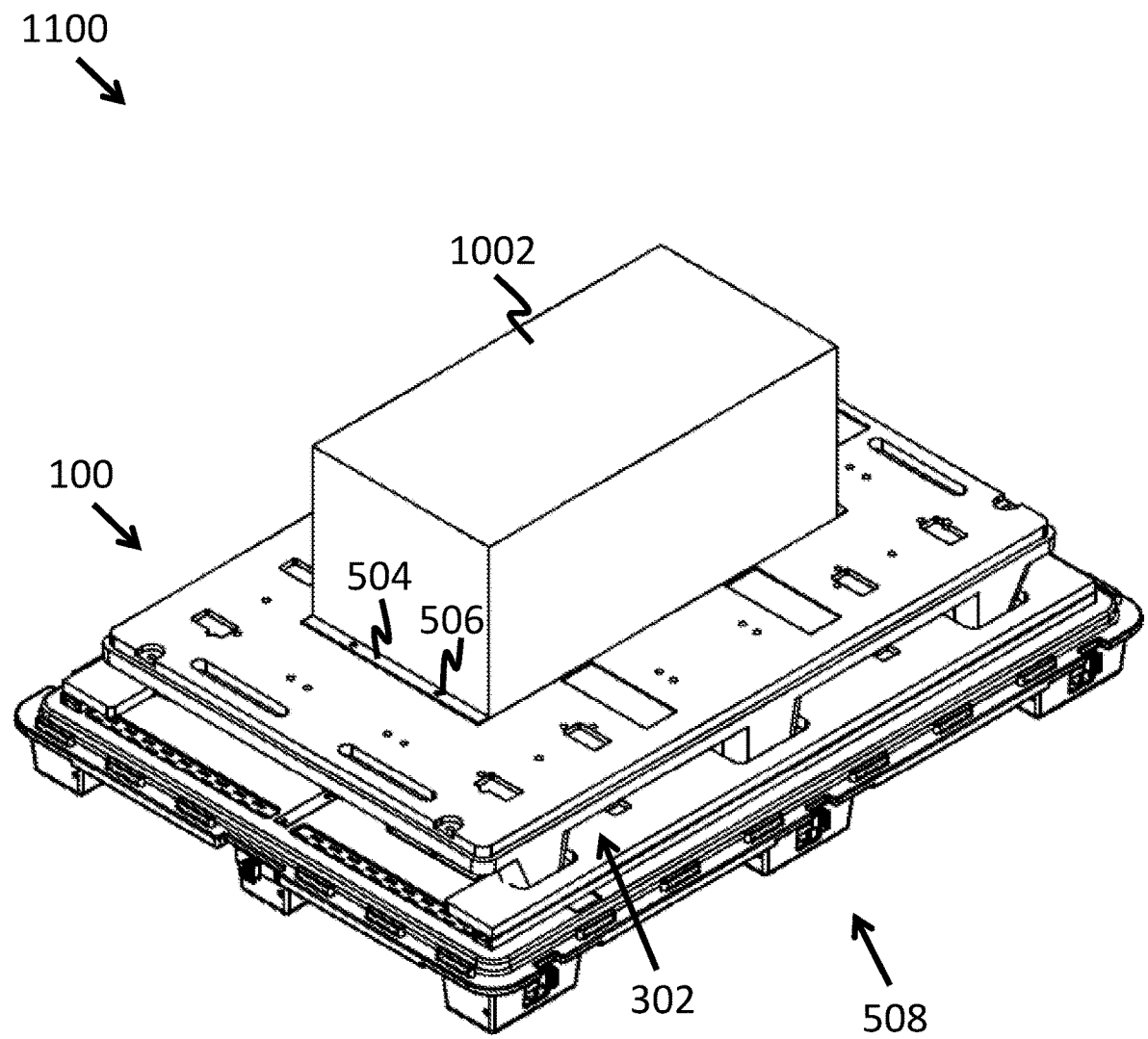
FIG. 11A is a perspective view illustrating one embodiment of a system for reusable shipping platform for transporting multiple electrical circuit breakers, according to the present disclosure.

FIG. 11A depicts one embodiment of a system 1100. The system 1100 may include the breadboard 100, the pallet 302, and the outer container 508. The system 1100 may include a breaker 1102. The breaker 1102 may include a six-pole breaker. The breaker 1102 may be disposed on the breadboard 100. The breaker 1102 may mount to the breadboard 100 with one or more bolts that may pass through one or more flanges 504 of the breaker 1102. The one or more flanges 504 may be disposed on one or more sides of the breaker 1102. For example, as depicted in FIG. 11A, the breaker 1102 may include two flanges 504 disposed on opposite sides of the breaker 1102 from each other. As is depicted in FIG. 11A, a flange 504 may include one or more apertures 506 through which a bolt may pass before it is screwed into an opening 104 or threaded insert 452 in the breadboard 100.

Figure 11B:
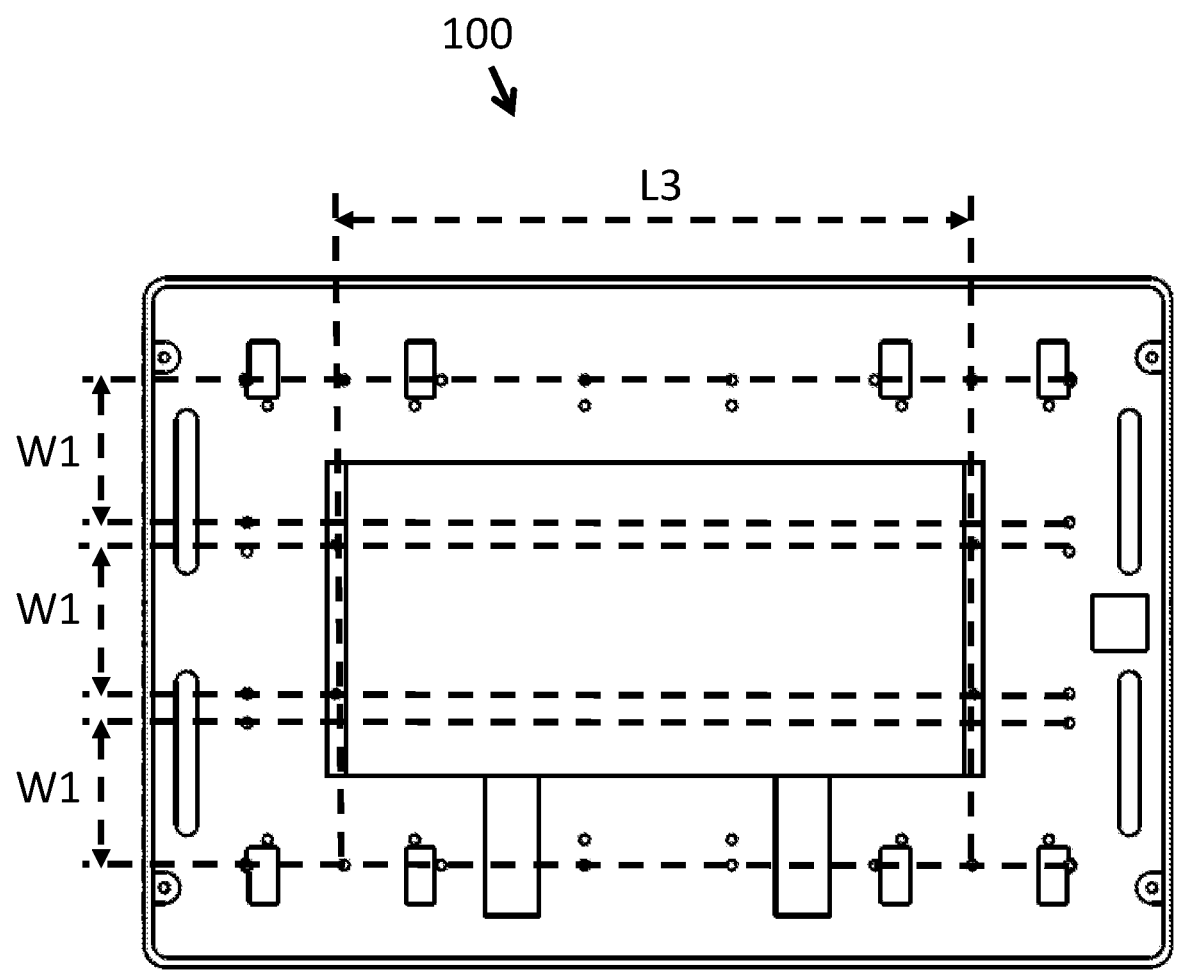
FIG. 11B is a top-down view illustrating one embodiment of the breadboard of FIG. 11A, according to the present disclosure.

FIG. 11B depicts one embodiment of the breaker 1102 disposed on the breadboard 100 as depicted in FIG. 11A. As depicted in FIG. 11A, one or more openings 104 of the breadboard 100 may be disposed in the breadboard 100 and may be laid out to allow a single breaker 1102 to be balanced about a center line for equal weight distribution on a long or short dimension of the breadboard 100. In one embodiment, the distance between apertures 506 in opposing flanges 506 of the breaker 1102 may include the length "L3," As shown in FIG. 11A, a spacing for one or more openings 104 including the length "L3" may be such that one breaker 1102 may be disposable in a center of the breadboard 100. The distance between apertures 506 on a single flange 504 may include the length "W1." As shown in FIG. 11A, the spacing for one or more openings 104 including the length "W1" may be such that one breaker 1102 may be disposable in the center of the breadboard 100.

Figure 12:
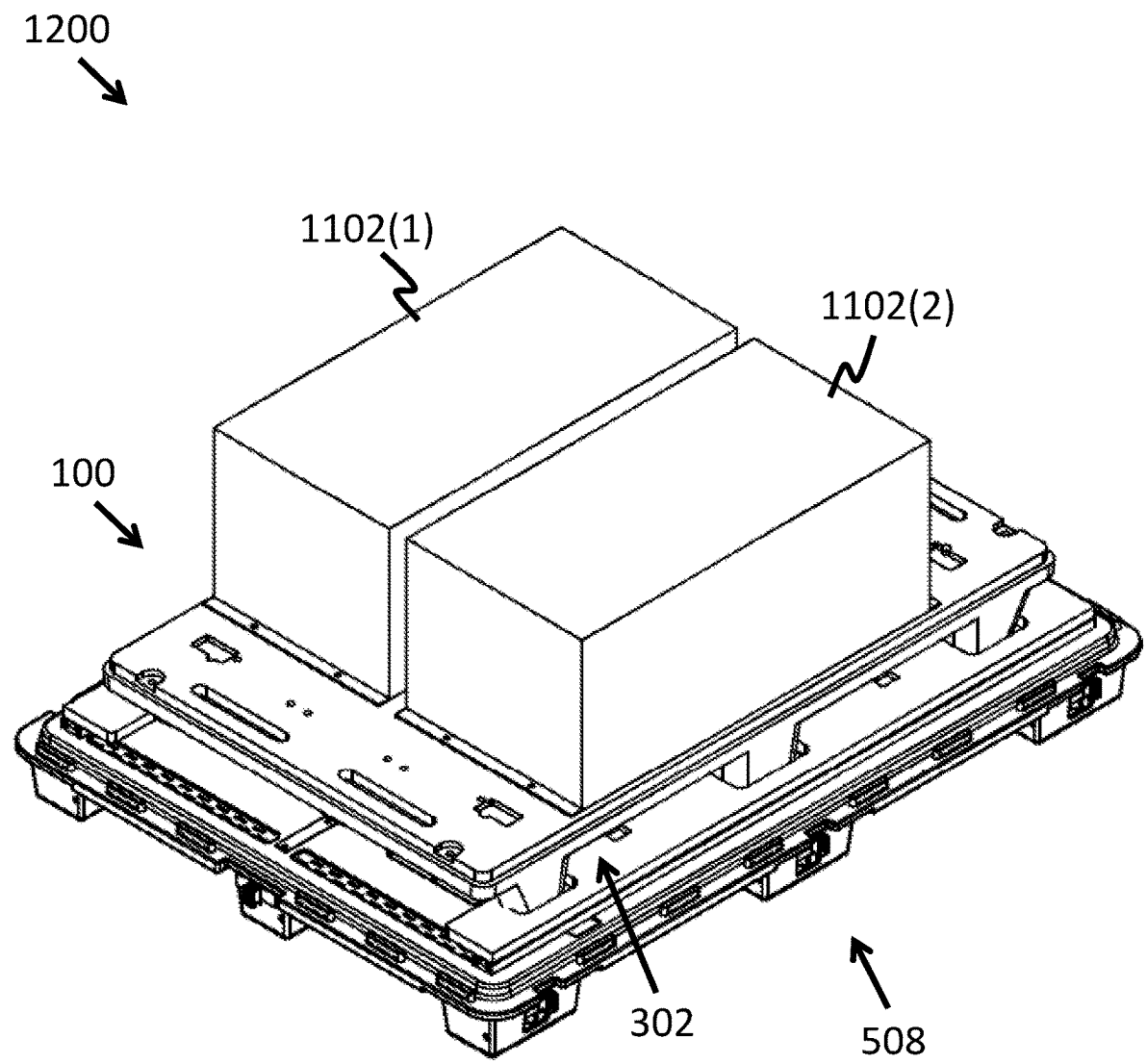
FIG. 12 is a perspective view illustrating one embodiment of a system for reusable shipping platform for transporting multiple electrical circuit breakers, according to the present disclosure.

FIG. 12 depicts one embodiment of a system 1200. The system 1200 may include the breadboard 100, the pallet 302, and the outer container 508. The system 1000 may include two breakers 1102(1)-(2). Each breaker 1102 may include a six-pole breaker. In some embodiments, one or more openings 104 of the breadboard 100 may be laid out to allow the two breakers 1102(1)-(2) to be balanced about a center line for equal weight distribution on a long or short dimension of the breadboard 100. The one or more openings may include spacings of "L3" and "W1" of FIG. 11B such that the two breakers 1102(1)-(2) may be disposable on a surface of the breadboard 100 equidistance from a center line that may be parallel to a long side of the breadboard 100.

Figure 13A:
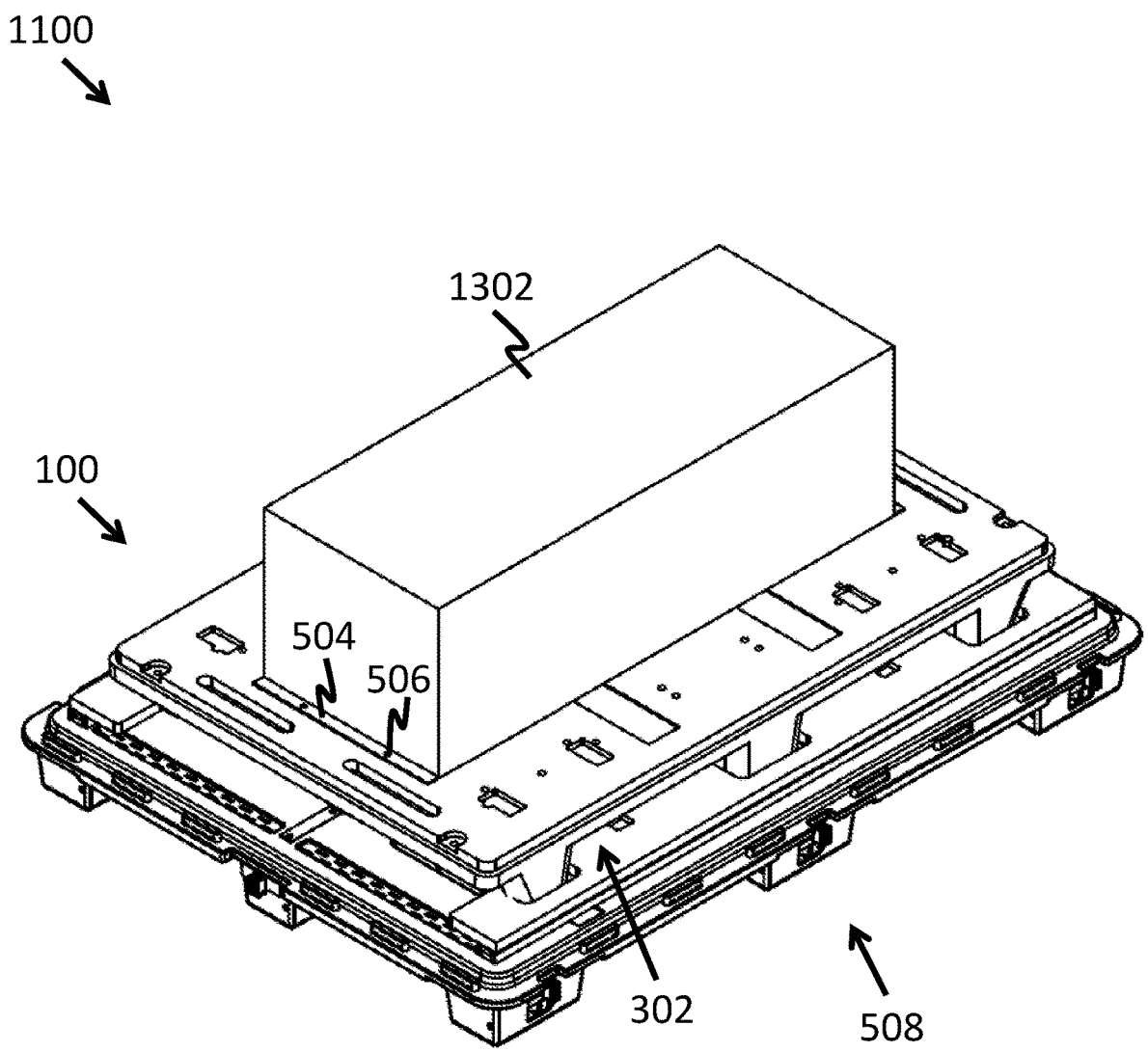
FIG. 13A is a perspective view illustrating one embodiment oft a system for reusable shipping platform for transporting multiple electrical circuit breakers, according to the present disclosure.

FIG. 13A depicts one embodiment of a system 1300. The system 1300 may include the breadboard 100, the pallet 302, and the outer container 508. The system 1300 may include a breaker 1302. The breaker 1302 may include an eight-pole breaker. The breaker 1302 may be disposed on the breadboard 100. The breaker 1302 may mount to the breadboard 100 with one or more bolts that may pass through one or more flanges 504 of the breaker 1302. The one or more flanges 504 may be disposed on one or more sides of the breaker 1302. For example, as depicted in FIG. 13A, the breaker 1302 may include two flanges 504 disposed on opposite sides of the breaker 1302 from each other. As is depicted in FIG. 13A, a flange 504 may include one or more apertures 506 through which a bolt may pass before it is screwed into an opening 104 or threaded insert 452 in the breadboard 100.

Figure 13B:
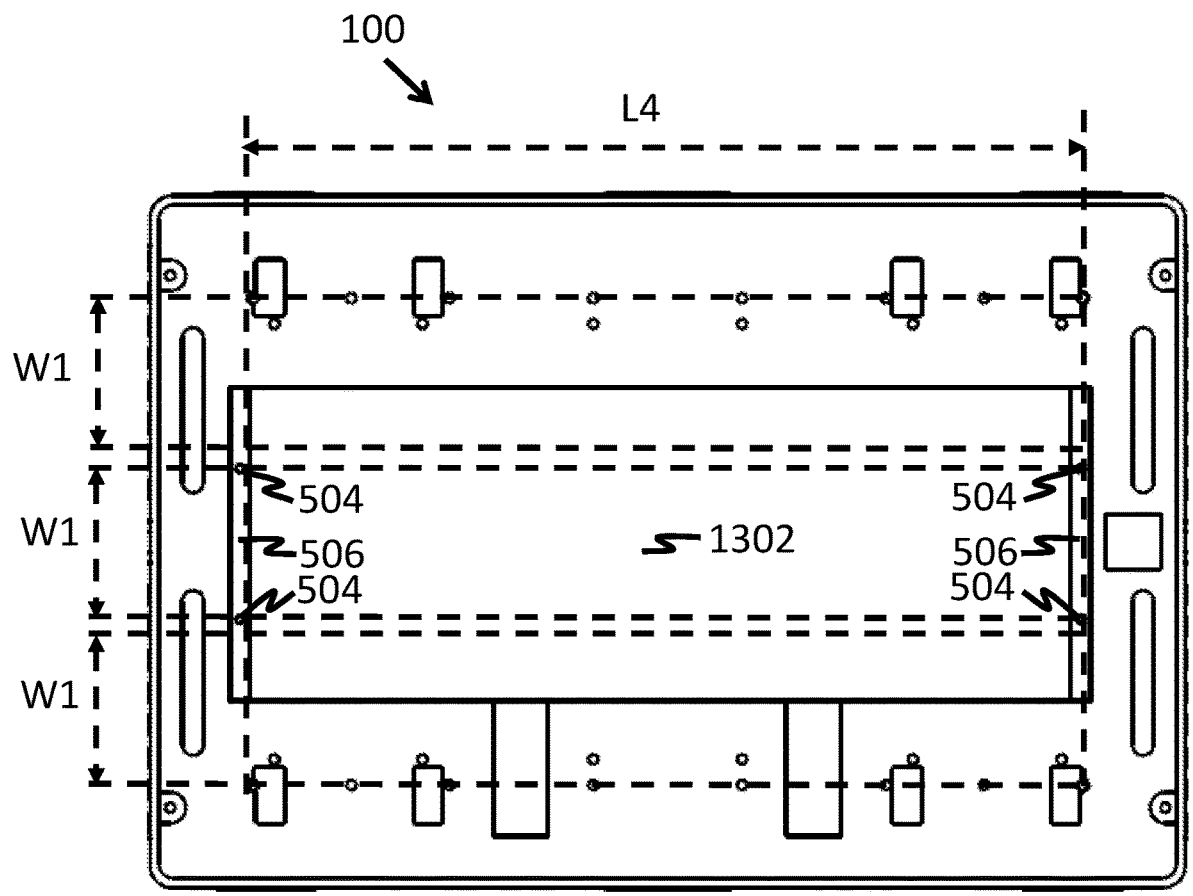
FIG. 13B is a top-down view illustrating one embodiment of the breadboard of FIG. 13A, according to the present disclosure.

FIG. 13B depicts one embodiment of the breaker 1302 disposed on the breadboard 100 as depicted in FIG. 13A. In some embodiments, one or more openings 104 of the breadboard 100 may be laid out to allow the breaker 1302 to be balanced about the center line for equal weight distribution on a long or short dimension of the breadboard 100. The distance between apertures 506 in opposing flanges 504 may include the length of "L4." As shown in FIG. 13B, the spacing for one or more openings 104 of the breadboard 100 may include the length "L4" such that the breaker 1302 may be disposable in the center of the breadboard 100. A distance between apertures 506 on a single flange 504 may include the length "W1." As shown in FIG. 13B, the spacing for one or more openings 104 of the breadboard 100 may include the length "W1" such that the breaker 1302 may be disposable in the center of the breadboard 100.

Figure 14:
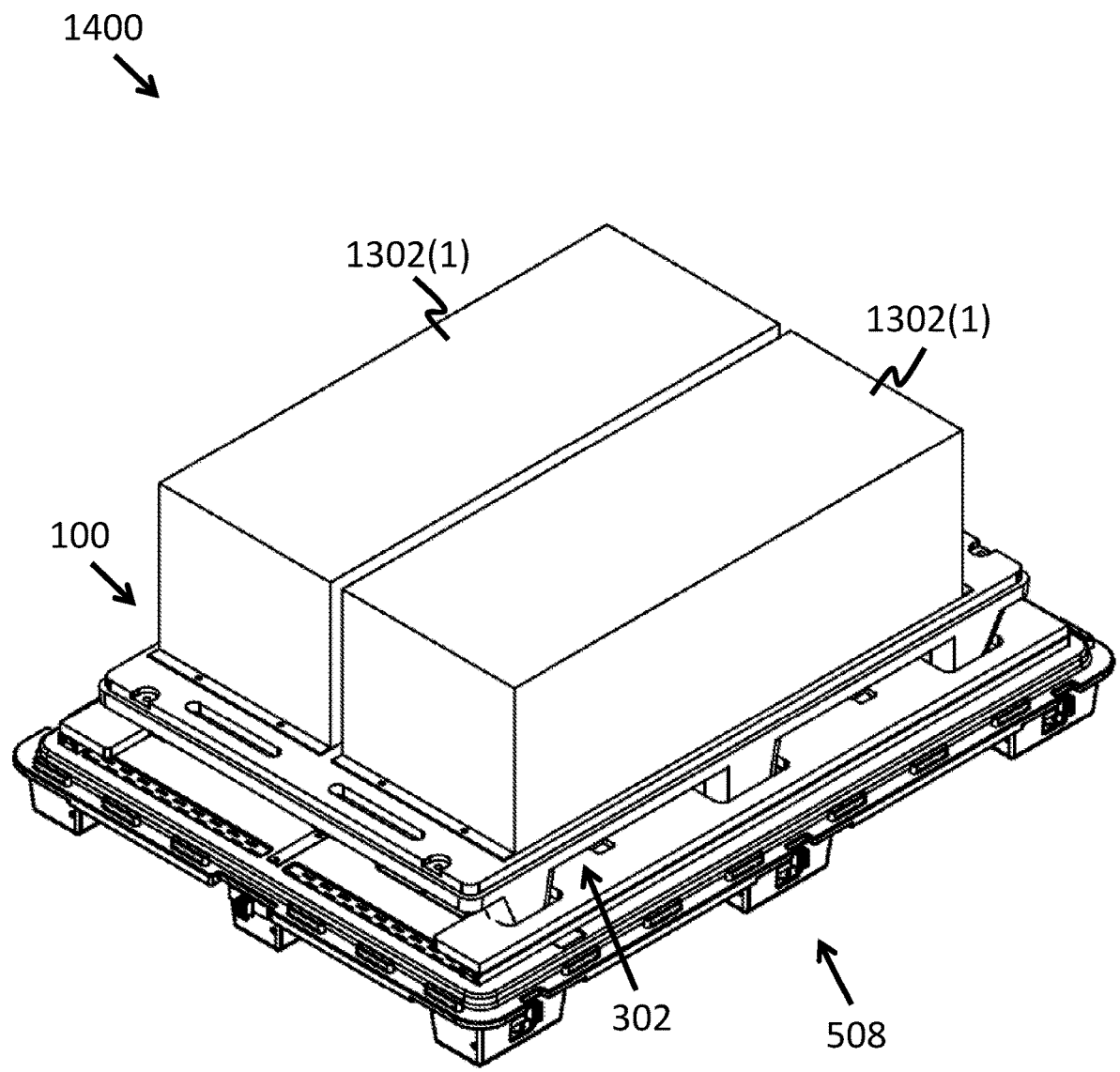
FIG. 14 is a perspective view illustrating one embodiment of a system for reusable shipping platform for transporting multiple electrical circuit breakers, according to the present disclosure.

FIG. 14 depicts one embodiment of a system 1300. The system 1300 may include the breadboard 100, the pallet 302, and the outer container 508. The system 1300 may include two breakers 1302(1)-(2). In some embodiments, one or more openings 104 on the breadboard 100 may be laid out on the breadboard 100 to allow the two breakers 1302(1)-(2) to be balanced about a center line for equal weight distribution on a long or short dimension of the breadboard 100. For example, one or more openings 104 may be disposed in the breadboard 100 with spacings of "L4" and "W1" as shown in FIG. 13B such that the two breakers 1302 may be disposable on the surface of the breadboard 100 equidistant from a center line that may be parallel to a long side of the breadboard 100.

In FIGS. 1-14, one or more of the openings 104 may be disposed in the board 102 of the breadboard 100 such that one or more of the apertures 506 of one or more breakers 502, 802, 1002, 1102, 1302 align with the one or more openings 104. This may allow a user to dispose a bolt in one or more apertures 504 and one or more aligned openings 104 to mount the one or more 502, 802, 1002, 1102, 1302 to the breadboard 100. The spacings, distances, or other positional configurations of the openings 104 may allow multiple sizes, shapes, or other configurations of breakers 502, 802, 1002, 1102, 1302 to be mounted to the breadboard 100, and thus, may allow the breadboard 100 to be reusable in transporting different types of breakers 502, 802, 1002, 1102, 1302.

Figure 15:
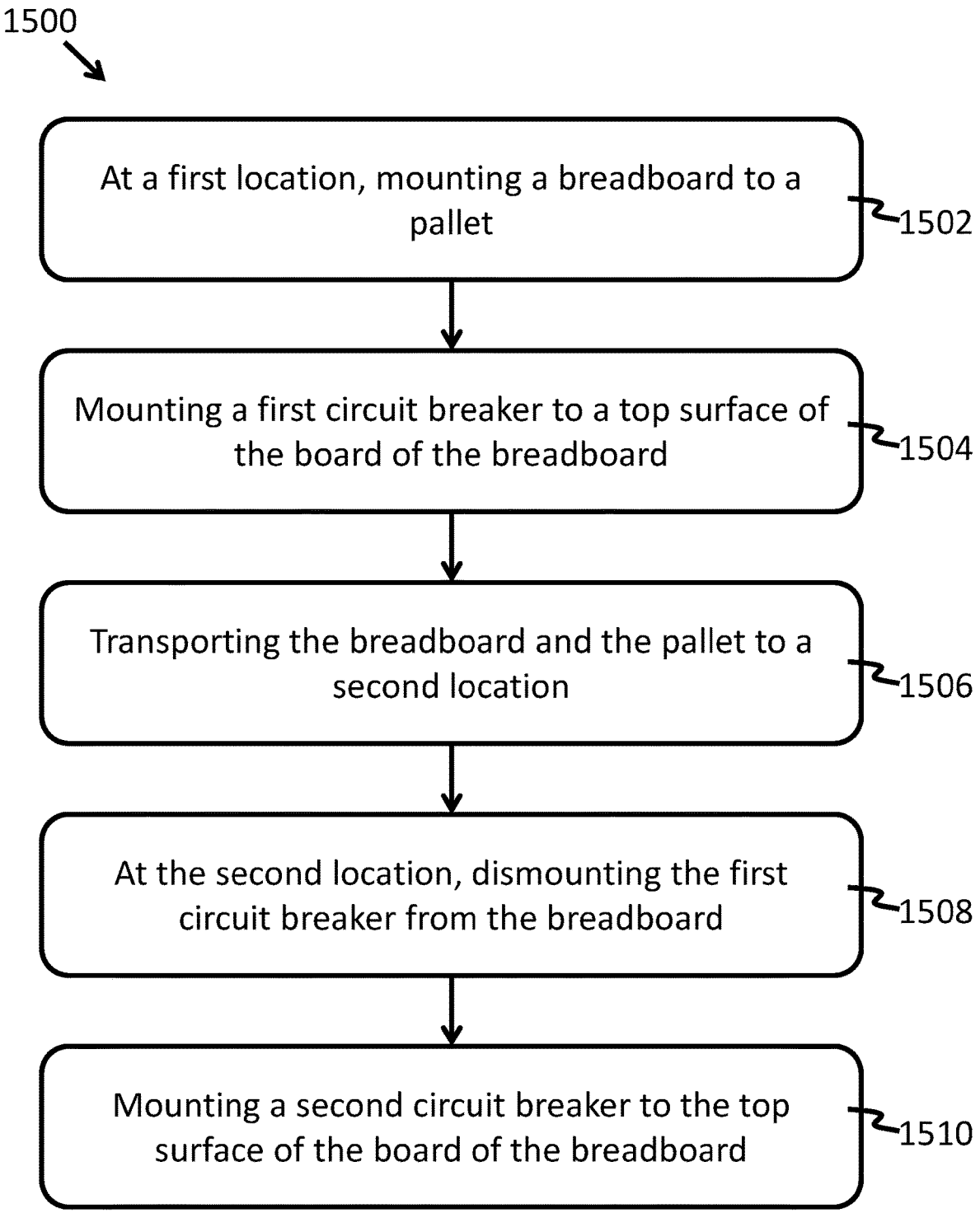
FIG. 15 is a flowchart illustrating one embodiment of a method of transporting and reusing a transport system for a circuit breaker according to the present disclosure.

FIG. 15 depicts one embodiment of a method 1500. The method 1500 may include a method of transporting and reusing a transport system for a circuit breaker. The method may include, at a first location, mounting 1502 a breadboard to a pallet. The breadboard may include a substantially flat board and a plurality of openings. The method 1500 may include mounting 1504 a first circuit breaker to a top surface of the board of the breadboard. The method 1500 may include transporting 1506 the breadboard and the pallet to a second location. The method 1500 may include, at the second location, dismounting 1508 the first circuit breaker from the breadboard. The method 1500 may include mounting 1510 a second circuit breaker to the top surface of the board of the breadboard.

In one embodiment, the first circuit breaker may include a flange. The flange may include an aperture. Mounting 1504 the first circuit breaker to the top surface of the board of the breadboard may include (1) aligning the aperture of the flange of the first circuit breaker with an opening of the plurality of openings of the breadboard, and (2) inserting a bolt through the aperture and the opening. In some embodiments, the method 1500 may further include mounting a second circuit breaker to the top surface of the board of the first breadboard.

In some embodiments, the breadboard of the method 1500 may include the breadboard 100. The pallet of the method 1500 may include the pallet 302. The board of the breadboard of the method 1500 may include the board 102. The plurality of openings of the method 1500 may include one or more openings 104. The first circuit breaker or the second circuit breaker of the method 1500 may include a circuit breaker 502, 802, 1002, 1102, 1302. A flange of a circuit breaker of the method 1500 may include the flange 504. An aperture of the flange of the method 1500 may include the aperture 506. In one or more embodiments, some of the steps of the method 1500 may include steps or other actions described above in relation to FIGS. 1-14.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed:

1. An apparatus, comprising:
   a breadboard, including
      a substantially flat board including a top surface and a bottom surface, wherein the top surface is disposed opposite the bottom surface, and
      a plurality of openings disposed in the board;
   a circuit breaker disposed on the top surface of the breadboard, wherein
      the circuit breaker includes a first flange disposed on a side of the first circuit breaker,
      the first flange includes a first aperture disposed in the first flange, and
      the first aperture is alignable with a first opening of the plurality of openings; and
   a pallet, including
      a top surface and a bottom portion disposed opposite the top surface, and
      a plurality of risers disposed on the bottom portion and extending in a direction opposite the top surface,
   wherein the bottom surface of the breadboard is mountable to the top surface of the pallet.

2. The apparatus of claim 1, wherein the breadboard further comprises a label cutout disposed in the board, wherein the label cutout includes an indentation in the top surface of the board.

3. The apparatus of claim 1, wherein the breadboard further comprises a bolt cutout disposed on an edge of the board, wherein the bolt cutout includes:
   an indentation in the top surface of the board; and
   a second aperture disposed in the indentation and configured to receive a bolt.

4. The apparatus of claim 1, further comprising a threaded insert disposed in a second opening of the plurality of openings, wherein the threaded insert includes:
   a body insertable into the second opening, including a threaded portion configured to receive a threaded portion of a threaded bolt; and
   a second flange disposed on the body.

5. The apparatus of claim 1, wherein the plurality of openings includes a row of openings disposed in a line, wherein the line is parallel to a side of the board.

6. The apparatus of claim 1, wherein the circuit breaker comprises at least one of:
a three-pole circuit breaker;
a four-pole circuit breaker;
a six-pole circuit breaker; or
an eight-pole circuit breaker.

7. A system for transporting circuit breakers, comprising:
a breadboard, including
a substantially flat board including a top surface and a bottom surface, wherein the top surface is disposed opposite the bottom surface, and
a plurality of openings disposed in the board;
a pallet, including
a top surface and a bottom portion disposed opposite the top surface wherein the bottom surface of the breadboard is mountable to the top surface of the pallet, and
a plurality of risers disposed on the bottom portion and extending in a direction opposite the top surface; and
a first circuit breaker disposed on the top surface of the board of the breadboard, wherein
the first circuit breaker includes a first flange disposed on a first side of the first circuit breaker,
the first flange includes a first aperture disposed in the first flange, and
the first aperture is alignable with a first opening of the plurality of openings.

8. The system of claim 7, wherein:
the first flange includes a second aperture disposed in the first flange; and
the second aperture is alignable with a second opening of the plurality of openings.

9. The system of claim 8, wherein:
a first length includes a length between the first aperture and the second aperture; and
a spacing between at least two openings of the plurality of openings includes the first length, wherein the at least two openings do not include the first opening and the second opening.

10. The system of claim 7, wherein:
the first circuit breaker includes a second flange disposed on a second side of the first circuit breaker, wherein the second side is opposite the first side;
the second flange includes a third aperture disposed in the second flange; and
the third aperture is alignable with a third opening of the plurality of openings.

11. The system of claim 7, further comprising a second circuit breaker disposed on the top surface of the board of the breadboard.

12. The system of claim 11, wherein the first circuit breaker and the second circuit breaker are disposed on the top surface of the board equidistant from a center line parallel with an edge of the board.

13. The system of claim 11, further comprising a third circuit breaker disposed on the top surface of the board of the breadboard.

14. The system of claim 13, further comprising a fourth circuit breaker disposed on the top surface of the board of the breadboard.

15. The system of claim 7, wherein the first circuit breaker comprises at least one of:
a three-pole circuit breaker;
a four-pole circuit breaker;
a six-pole circuit breaker; or
an eight-pole circuit breaker.

16. A method of transporting and reusing a transport system for a circuit breaker, comprising:
at a first location, mounting a breadboard to a pallet, wherein the breadboard includes a substantially flat board and a plurality of openings;
mounting a first circuit breaker to a top surface of the board of the breadboard, wherein
the first circuit breaker includes a first flange, and the first flange includes an aperture, and
mounting the first circuit breaker to the top surface of the board of the breadboard includes
aligning the aperture of the first flange of the first circuit breaker with an opening of the plurality of openings of the breadboard, and
inserting a bolt through the aperture and the opening;
transporting the breadboard and the pallet to a second location;
at the second location, dismounting the first circuit breaker from the breadboard;
mounting a second circuit breaker to the top surface of the board of the breadboard.

17. The method of claim 16, further comprising mounting a third circuit breaker to the top surface of the board of the breadboard.

18. The method of claim 17, wherein mounting the third circuit breaker to the top surface of the board of the breadboard comprises disposing the third circuit breaker equidistant from the second circuit breaker and from a center line that is parallel with an edge of the board of the breadboard.

19. The apparatus of claim 1, wherein the circuit breaker comprises a rectangular base.

20. The apparatus of claim 1, wherein the first flange further comprises a third aperture disposed in the first flange.

* * * * *